United States Patent
Posseme et al.

(10) Patent No.: US 10,658,197 B2
(45) Date of Patent: May 19, 2020

(54) METHOD FOR PRODUCING LOW-PERMITTIVITY SPACERS

(71) Applicants: COMMISSARIAT A L'ENERGIE ATOMIQUE ET AUX ENERGIES ALTERNATIVES, Paris (FR); STMICROELECTRONICS SA, Montrouge (FR); STMICROELECTRONICS (CROLLES 2) SAS, Crolles (FR)

(72) Inventors: Nicolas Posseme, Sassenage (FR); Maxime Garcia-Barros, Ivry sur Seine (FR); Yves Morand, Grenoble (FR)

(73) Assignees: COMMISSARIAT A L'ENERGIE ATOMIQUE ET AUX ENERGIES ALTERNATIVES, Paris (FR); STMICROELECTRONICS SA, Montrouge (FR); STMICROELECTRONICS (CROLLES 2) SAS, Crolles (FR)

(*) Notice: Subject to any disclaimer, the term of this patent is extended or adjusted under 35 U.S.C. 154(b) by 111 days.

(21) Appl. No.: 15/390,077

(22) Filed: Dec. 23, 2016

(65) Prior Publication Data
US 2017/0186623 A1 Jun. 29, 2017

(30) Foreign Application Priority Data
Dec. 23, 2015 (FR) .................... 15 63258

(51) Int. Cl.
*H01L 21/324* (2006.01)
*H01L 21/3115* (2006.01)
(Continued)

(52) U.S. Cl.
CPC ...... *H01L 21/324* (2013.01); *H01L 21/02057* (2013.01); *H01L 21/2236* (2013.01);
(Continued)

(58) Field of Classification Search
None
See application file for complete search history.

(56) References Cited

U.S. PATENT DOCUMENTS

| 2003/0011080 A1 | 1/2003 | Deshpande et al. |
| 2004/0171201 A1* | 9/2004 | Gambino .......... H01L 21/26506 438/184 |

(Continued)

FOREIGN PATENT DOCUMENTS

WO  WO 2015/080945 A1  6/2015

OTHER PUBLICATIONS

French Preliminary Search Report dated Aug. 22, 2016 in French Application 15 63258 filed on Dec. 23, 2015 (with English Translation of Categories of Cited Documents and Written Opinion).

*Primary Examiner* — Alexander G Ghyka
(74) *Attorney, Agent, or Firm* — Oblon, McClelland, Maier & Neustadt, L.L.P.

(57) ABSTRACT

There is provided a method for manufacturing a transistor from a stack including at least one gate pattern comprising at least one flank, the method including forming at least one gate spacer over at least the flank of the gate pattern; and reducing, after a step of exposure of the stack to a temperature greater than or equal to 600° C., of a dielectric permittivity of the at least one gate spacer, the reducing including at least one ion implantation in a portion at least of a thickness of the at least one gate spacer.

30 Claims, 7 Drawing Sheets

(51) Int. Cl.
*H01L 21/02* (2006.01)
*H01L 21/223* (2006.01)
*H01L 21/322* (2006.01)
*H01L 21/447* (2006.01)
*H01L 21/762* (2006.01)
*H01L 21/8234* (2006.01)
*H01L 29/66* (2006.01)
*H01L 29/49* (2006.01)
*H01L 29/78* (2006.01)

(52) U.S. Cl.
CPC .... *H01L 21/31155* (2013.01); *H01L 21/3221* (2013.01); *H01L 21/447* (2013.01); *H01L 21/762* (2013.01); *H01L 29/4908* (2013.01); *H01L 29/665* (2013.01); *H01L 29/6653* (2013.01); *H01L 29/6656* (2013.01); *H01L 29/66507* (2013.01); *H01L 29/66545* (2013.01); *H01L 29/66628* (2013.01); *H01L 29/66772* (2013.01); *H01L 29/7827* (2013.01); *H01L 21/223* (2013.01); *H01L 21/823468* (2013.01)

(56) References Cited

U.S. PATENT DOCUMENTS

| | | |
|---|---|---|
| 2006/0220152 A1 | 10/2006 | Huang et al. |
| 2008/0128766 A1 | 6/2008 | Huang et al. |
| 2011/0269278 A1 | 11/2011 | Hoentschel et al. |
| 2013/0149830 A1* | 6/2013 | Rhee ................ H01L 29/66477 438/303 |

* cited by examiner

METHOD FOR PRODUCING LOW-PERMITTIVITY SPACERS

TECHNICAL FIELD OF THE INVENTION

This invention relates to transistors, particularly transistors of the MOS (Metal Oxide Semi-Conductor) type and more particularly the realization of the gate spacers of such transistors.

PRIOR ART

FIG. 1 is a cross-section view of an embodiment of at least one gate 100. The gate 100 is conventionally comprised of a stack of layers of which one is comprised of polycrystalline silicon 103.

A currently used technique consists in manufacturing integrated circuits using elaborated substrates of the silicon on insulator type (designated by the acronym SOI). The SOI elaborated substrate is characterized by the presence of a thin surface layer of monocrystalline silicon, of Germanium or of Silicon-Germanium resting on a continuous insulating layer of oxide in particular of silicon, referred to as BOX (buried oxide layer). The solidity and the mechanical rigidity of the whole are provided by a layer on which rests the BOX and which constitutes the body of the SOI substrate, often qualified as "bulk" in order to indicate that the starting substrate is very generally made from solid silicon. This structure offers many advantages for the carrying out of MOSFET transistors. In particular, it allows for a drastic reduction of the parasitic capacitances due to the presence of the continuous insulating layer.

An improvement of the basic self-aligned-contact technique, which has been universally adopted, consists in the forming of spacers on the flanks of the gate typically made of silicon nitride (SiN). In order maintain low electrical access resistances to the source and drain electrodes, despite the reduction in the size of transistors, their section had to be increased.

The known methods for realizing transistors cause source-gate and drain-gate parasitic capacitances that are sometimes very strong according to the applications.

In order to reduce these parasitic capacitances a solution provides to use a material referred to as "Low-k", i.e. with low dielectric permittivity, in place of the silicon nitride. A layer of "Low-k" material is as such deposited on the gate. The step of epitaxy of the source and of the drain is carried out in what follows.

This solution based on the deposition of Low-k materials makes it possible to reduce the parasitic capacitances but not in a sufficiently satisfactory manner.

There is therefore a need consisting in proposing a solution to further reduce the parasitic capacitances. Such is the objective of this invention.

SUMMARY OF THE INVENTION

This invention relates to a method for manufacturing a transistor using a stack comprising at least one gate pattern comprising at least one flank and being located above an underlying layer made of a semi-conductor material, characterized in that it comprises at least the following steps:

Forming at least partially at least one gate spacer comprising at least the deposition of a layer made of a non-carbon material on the at least one flank of the gate pattern;

After said step of depositing of at least one layer made of a non-carbon material, at least one step of exposing the stack to a temperature greater than or equal to 600° C.;

After said at least one step of exposing, at least one step of reducing the dielectric permittivity of the at least one gate spacer, with said step of reducing comprising at least one ion implantation in a portion at least of the thickness of the at least one gate spacer, with the parameters of the implantation, in particular the species implanted, the energy and the implantation dose, being chosen in such a way that the implantation reduces the dielectric permittivity of at least one spacer.

The reduction in the dielectric permittivity of the spacers by ion implantation after the step of forming the source and the drain makes it possible to not desorb the ions implanted in the spacers, for example during the forming of the source and of the drain, in particular due to the high temperatures at play.

This consequently makes it possible to not increase again the dielectric permittivity of the spacers during the step of forming the source and the drain for example.

Indeed, in the case of an epitaxy of the source/drain zone, a temperature of about 500° C. to 800° C. is often required. Moreover, whether or not the source/drain zones are formed by epitaxy, a step of implanting dopants and an annealing at a temperature of about 1050° C. aiming to activate the dopants implanted in the source/drain zone are generally carried out.

These high temperatures generally result in an increase in the dielectric permittivity of the Low-k spacers when the latter are already formed. For example, a spacer that is comprised of SiCO initially has a low dielectric permittivity, however following the step of forming the source and the drain which entails an annealing at high temperature, the carbon contained in the spacer is desorbed and the spacer is now composed only of $SiO_2$, of which the dielectric permittivity is higher than that of SiCO. This invention proposes to decrease the dielectric permittivity of the spacers after these steps of heating in such a way that their dielectric permittivity is not affected.

In the framework of the development of this invention, it has been shown, as shown in FIGS. 24 and 25, that when the spacers undergo a decrease in their dielectric permittivity before the step of epitaxy and therefore of annealing, their structure is degraded and their permittivity increases again after the forming of the source and of the drain. Indeed, FIG. 24 shows an electron microscopy image of spacers of SiOCN which after the step of etching, is transformed into $SiO_2$. Shown in FIG. 25 which is also an electron microscopy image, note that the structural integrity of the spacer is substantially altered by the step of epitaxy of the source and of the drain. This invention resolves at least partially these disadvantages.

Reducing the dielectric permittivity as late as possible during the method of manufacturing the transistor makes it possible to prevent increasing it again during the other steps of the method.

This also makes it possible to prevent etching the spacers of low dielectric permittivity during the step of wet cleaning which is usually carried out before the forming of the source and of the drain.

According to another embodiment this invention relates to a method of manufacturing a transistor from a stack comprising at least one gate pattern comprising at least one flank and being located above an underlying layer made of a semi-conductor material, comprising at least the following steps:

Forming at least partially of at least one gate spacer comprising at least the deposition of a layer made of a non-carbon material on the at least one flank of the gate pattern;

After said step of depositing of the at least one layer made of a non-carbon material, forming of at least one source/drain zone in a peripheral zone surrounding said gate pattern and located above said underlying layer;

After said at least one step of exposing, at least one step of reducing the dielectric permittivity of the at least one gate spacer, with said step of reducing comprising at least one ion implantation in a portion at least of the thickness of the at least one gate spacer, with the parameters of the implantation, in particular the species implanted, the energy and the implantation dose, being chosen in such a way that the implantation reduces the dielectric permittivity of at least one spacer.

According to an embodiment, the step of forming the at least one source/drain zone comprises at least one step during which said stack is exposed to a temperature greater than a threshold temperature Ts. Said threshold temperature Ts being greater than a temperature that would have allowed for the desorption of the ions implanted later in the step of reducing the dielectric permittivity of the spacers. Ts is higher, equal to or less than 600° C.

According to an embodiment, the step of forming a spacer comprises at least the deposition of a layer made of a non-carbon material in such a way as to cover at least partially one of the flanks of the gate pattern and possibly to extend on at least one other surface.

According to an embodiment, the method comprises at least one step of forming at least one source/drain zone in a peripheral zone surrounding said gate pattern and located above said underlying layer, and more preferably said step of forming of the at least one source/drain zone comprises said at least one step of exposing at a temperature greater than or equal to 600° C.

According to an embodiment, the step of forming the at least one source/drain zone comprises at least one step during which said stack is exposed to a temperature greater than or equal to 600° C.

Advantageously, the step of forming the at least one source/drain zone comprises an activation annealing of the at least one source/drain zone, and more preferably the annealing comprises said at least one step of exposing at a temperature greater than or equal to 600° C.

Advantageously, the step of forming the at least one source/drain zone comprises a step of epitaxy of the at least one source/drain zone, and the step of epitaxy comprises said at least one step of exposing at a temperature greater than or equal to 600° C.

According to another embodiment, the method comprises at least one step of silicidation electrical contacts on the gate and/or on the at least one source/drain zone, and more preferably said at least one step of silicidation comprises said at least one step of exposing at a temperature greater than or equal to 600° C.

According to another embodiment, the method comprises at least one step of wet cleaning of the surfaces of the stack, and more preferably said at least one step of cleaning comprises said at least one step of exposing at a temperature greater than or equal to 600° C.

According to another embodiment, the method comprises at least one step of wet cleaning of the surfaces of the stack, and more preferably said at least one step of cleaning is carried out before said step of reducing the dielectric permittivity.

According to an embodiment, the step of exposing the stack to a temperature greater than or equal to 600° C. is comprised by at least one of the following steps:

Epitaxy of the at least one source/drain zone;
Activation annealing of dopants implanted in the at least one source/drain zone;
Silicidation of electrical contacts;

Advantageously, this invention can also be used in the case of the realization of transistors of the FinFET type and/or based on the so-called FinFet transistor technology.

BRIEF DESCRIPTION OF THE FIGURES

The purposes, objects, as well as the characteristics and advantages of the invention shall appear better in the detailed description of an embodiment of the latter which is shown in the following accompanying drawings wherein.

Figure 1:
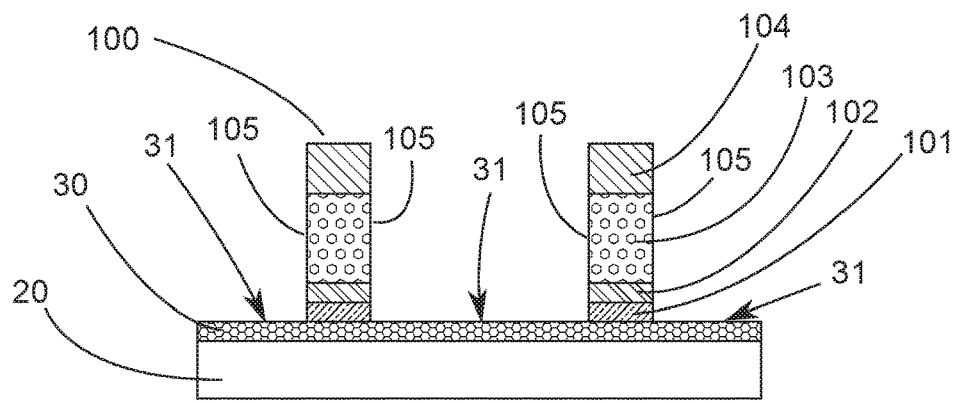
FIGS. 1 to 6 show successive phases of realization of spacers wherein the gate stack is formed at the beginning of the method.

The attached drawings are given by way of example and do not limit the invention. These drawings are diagrammatical representations and are not necessarily to the scale of the practical application. In particular, the relative thicknesses of the layers and of the substrates are not representative of reality.

DETAILED DESCRIPTION OF THE INVENTION

It is specified that in the framework of this invention, the dielectric permittivity of a material is defined as the ratio between the norm of the electric displacement field and that of the electric field applied to the material. As such this physical magnitude describes the response of a given medium to an applied electric field. At the microscopic level, the permittivity of a material is linked to the electrical polarizability of the molecules or atoms that the material is comprised of. It is generally expressed in F/m.

The word "dielectric" corresponds to a material of which the electrical conductivity is sufficiently low in the given application to serve as an insulator.

It is specified that in the framework of this invention, the terms "on", "surmounted" or "underlying" or the equivalents thereof do not necessarily mean "in contact with". As such for example, the deposition of a first layer on a second layer, does not necessarily mean that the two layers are directly in contact with one another but this means that the first layer covers at least partially the second layer by being, either directly in contact with it, or by being separated from it by another layer or another element.

In the description that follows, the thicknesses are generally measured according to directions perpendicular to the plane of the lower face of the layer to be etched or of a substrate on which the lower layer is arranged. As such, the thicknesses are generally measured according to a vertical direction in the figures shown. On the other hand, the thickness of a layer covering the flank of a pattern, such as the gate of a transistor, is measured according to a direction perpendicular to this flank.

In what follows, selective etching means the removing via etching of a given material by preserving at least partially, via the selectivity of the method used, other materials.

The term "gate pattern" means any three-dimensional structure aiming to form or to be replaced by a gate stack (the term "gate stack" and the term "gate" both have the same definition in the rest of this description). Indeed, a gate pattern can be sacrificial and be used only as a three-dimensional structure for the forming of spacers or of source/drain zones for example. Then the gate pattern can be removed in order to allow for the formation of the gate stack comprising the functional layers. This type of method wherein the gate stack is formed after the spacers and/or the source/drain zones is usually qualified as "gate-last". Inversely, a gate pattern can be a gate stack configured to form a gate before the forming of the spacers and of the source/drain zones for example. This type of method wherein the gate stack is formed before the spacers and/or the source/drain zones is usually qualified as "gate-first". As such, a gate pattern here meaning as being a three-dimensional structure comprising or not a gate stack is configured to spatially define a gate stack.

The term "first level of spacers" means one or several spacers formed by a first layer of materials. As such a spacer level comprises at least one spacer, advantageously two spacers, with each one located on one of the flanks of the gate. A first level of spacers is distinguished from a second level of spacers by the fact that the second level of spacers is formed by at least one layer on the flanks of the first level of spacers and preferentially after the forming of the first level of spacers.

The term "conformal" means a layer geometry that has, to the nearest manufacturing tolerances, a constant thickness despite the layer direction changes, for example on the level of gate pattern flanks.

The term "step" does not necessarily mean that the actions carried out during this step are simultaneous or immediately successive. Certain actions of a first step can in particular be followed by actions linked to another step, and other actions of the first step can be carried out afterwards. As such, the term step does not necessarily mean actions that are unitary and inseparable over time and in the chaining of the phases of the method.

The "nature" of a material means its chemical composition independently of any doping. As such, two spacers can be of the same nature but have different doping from one another.

Different doping means a different concentration of dopant between two materials. This concentration can be a zero concentration of dopants.

Preferably, this solution concerns CMOS transistors, in particular of the MOSFET type. It shall be seen in what follows that they can be produced from substrates of the SOI type but this is not limiting, in particular as to the structure and the material of the starting substrate.

Before beginning a detailed review of embodiments of the invention, hereinafter are announced optional characteristics which can possibly be used in association or alternatively:

Advantageously, during the ion implantation of the step of reducing the dielectric permittivity of at least one spacer, said spacers cover at least partially the gate pattern and leaves exposed zones located outside of the gate pattern. In particular, the zones intended to form the source and drain are not covered by the spacer when the ion implantation is carried out in this spacer.

Preferably, before the ion implantation a step of etching is carried out of the layer made of a non-carbon material outside of the flanks of the gate pattern.

During the ion implantation said at least one spacer does not cover the zones intended to form the source and drain.

During the ion implantation said at least one spacer is present solely on the gate pattern. More preferably said at least one spacer covers solely the gate pattern and more preferably covers solely the flanks of the gate pattern.

Advantageously, the ion implantation is carried out with ions with a hydrogen base (type NH3, HBr, CxHy for example in the case of an implantation in a plasma reactor) or with an ion base taken for example from at least one of the following species: hydrogen, helium.

This makes it possible to reduce the dielectric permittivity of the spacers. Using light ions such as Hydrogen and/or Helium moreover allows for an implantation without spraying of the spacer.

Advantageously, the ion implantation is carried out by plasma.

This allows for a homogeneous implantation in the volume of the spacers, as well as an implantation on very low thicknesses.

Advantageously, said implantation carried out by plasma is isotropic. This allows for a homogeneous implantation of the spacers.

Alternatively, the ion implantation is carried out by an implanter, more preferably an ion beam that is more preferably inclined, in this case and more preferably, ions with a Hydrogen or Helium base are to be considered with priority.

The inclination of the ion beam makes it possible to implant with precision the flanks of the spacers.

Advantageously, the implantation is carried out full wafer.

Advantageously, the ion implantation is carried out in such a way as to implant the spacer on at least one portion of its thickness. This makes it possible to precisely control the global dielectric permittivity of the spacer.

Advantageously, the implantation of the spacer is carried out on a thickness preferably between 1 nm and 30 nm, preferentially between 5 nm and 20 nm, and advantageously between 10 nm and 15 nm.

This makes it possible to precisely control the global dielectric permittivity of the spacer.

Advantageously, the ion implantation is carried out in such a way as to implant the spacer over its entire thickness.

This allows for a homogenization of the dielectric permittivity of the spacer in its volume.

Advantageously, the at least one spacer comprises at least one material having a nitride base.

This makes it possible to use common materials in microelectronics while still having a material of which the dielectric permittivity can be adjusted via ion implantation.

Advantageously, the at least one spacer comprises at least one material of which the dielectric permittivity is, before the step of reducing, greater than or equal to 7.

This allows for the use of standard materials and without constraints during subsequent steps relating to the retaining of their dielectric permittivity.

Advantageously, the at least one spacer comprises at least one material of which the dielectric permittivity is, after the step of reducing, less than 7 and preferentially between 3 and 6, and advantageously less than or equal to 4.

This makes it possible to have spacers that have a very low dielectric permittivity at the end of the method of manufacturing.

Advantageously, the forming of at least one spacer comprises a deposition of a first dielectric layer on the at least one flank of the gate pattern in such a way as to form at least one first level of spacers.

This allows for the forming of a first level of spacers.

Advantageously, the deposition of the first dielectric layer is followed by the deposition of a second dielectric layer on the at least one first level of spacers of the gate pattern in such a way as to form at least one second level of spacers.

This allows for the forming of a second level of spacers.

Advantageously, the deposition of the first dielectric layer is a conformal deposition.

This makes it possible to control the thickness of the first level of spacers.

Advantageously, the deposition of the second dielectric layer is a conformal deposition.

This makes it possible to control the thickness of the second level of spacers.

Advantageously, the thickness of the first dielectric layer is between 5 nm and 30 nm, more preferably between 5 nm and 20 nm, and preferably equal to 10 nm.

Advantageously, the thickness of the second dielectric layer is between 0 nm and 10 nm.

Advantageously, the ion implantation is carried out after a step of silicidation of electrical contacts on the gate and/or on the source/drain zone, and the step of ion implantation is carried out after said step of silicidation electrical contacts.

This makes it possible to carry out the resuming of electrical contacts while still protecting the zones located under the silicided portions during the steps of ion implantations.

According to an embodiment, the method comprises a step of silicidation of electrical contacts on the gate, and advantageously, the step of ion implantation is carried out after said step of silicidation electrical contacts.

According to an embodiment, the method comprises a step of silicidation on the source/drain zone, and advantageously the step of ion implantation is carried out after said step of silicidation on the source/drain zone.

According to an embodiment, the step of silicidation is carried out at a temperature between 300° C. and 700° C., more preferably between 400° C. and 500° C.

This temperature range does not degrade the dielectric permittivity of the spacers since the reduction in their dielectric permittivity is carried out after this step of silicidation.

Advantageously, the method comprises, after the step of silicidation and before the ion implantation, a step of surface cleaning.

Advantageously, the step of cleaning comprises a wet cleaning.

Advantageously, the wet cleaning is with a peroxymonosulphuric acid base.

Advantageously, the step of epitaxy of the at least one source/drain zone comprises at least one annealing carried out before the step of reducing the dielectric permittivity of at least one spacer.

According to an embodiment, the step of epitaxy of the at least one source/drain zone is carried out, at least partially, at a temperature greater than 500° C.

According to an embodiment, the step of forming of at least one source/drain zone comprises, after the step of epitaxy, at least one annealing at a temperature between 600° C. and 1200° C., more preferably between 800° C. and 1100° C. and advantageously equal to 1050° C., and advantageously the step of ion implantation is carried out after said step of annealing According to an embodiment, the forming of the at least one source/drain zone in said peripheral zone surrounding said gate pattern is preceded by a cleaning of at least the surface of the underlying layer on at least said peripheral zone.

This makes it possible to not affect the reduction of the permittivity of the spacers since this reduction in dielectric permittivity is carried out afterwards.

According to an embodiment, the cleaning is a wet cleaning.

According to an embodiment, the wet cleaning is with a hydrogen fluoride base.

According to an embodiment, the underlying layer comprises at least one semi-conductor material.

Advantageously, the semi-conductor material is taken from: silicon (Si), germanium (Ge), silicon-germanium (SiGe).

Advantageously, the ion implantation comprises a first and a second ion implantation carried out after the first ion implantation.

This allows for two degrees of freedom in the choice of the ions to be implanted, and therefore in the dielectric permittivity of the spacers.

Advantageously, the first ion implantation is carried out in order to reduce the dielectric permittivity of the first level of spacers.

This allows for two degrees of freedom in the choice of the ions to be implanted, and therefore in the dielectric permittivity of the spacers.

Advantageously, the first ion implantation is carried out in such a way as to implant at least one internal face of the first level of spacers so as to reduce the dielectric permittivity of the first level of spacers.

This makes it possible to implant solely the first spacer level without affecting the second level of spacers.

Advantageously, the gate stack is between two spacers forming the first level of spacers, according to an embodiment the method comprises a step of removing a portion of the gate stack in such a way as to define a cavity between the two spacers forming the first level of spacers and advantageously the first ion implantation is carried out in such a way as to implant at least one internal face of the first level of spacers, said internal face being turned facing said cavity, so as to reduce the dielectric permittivity of the first level of spacers.

Advantageously, said ion implantation is more preferably inclined in the direction of said internal face.

Advantageously, the ion implantation is carried out by plasma at a pressure greater than or equal to 80. This makes it possible to favor the implantation on the flanks of the structures. In this case this concerns internal faces of the first level of spacers.

Advantageously, the second ion implantation is carried out in order to reduce the dielectric permittivity of the second level of spacers.

This allows for two degrees of freedom in the choice of the ions to be implanted, and therefore in the dielectric permittivity of the spacers.

Advantageously, the second ion implantation is carried out in such a way as to implant at least one external face of the second level of spacers so as to reduce the dielectric permittivity of the second level of spacers.

This makes it possible to implant solely the second spacer level without affecting the first level of spacers.

Advantageously, the method comprises a step consisting in exposing at least one external face of the second level of spacers and advantageously the second ion implantation is carried out in such a way as to implant at least said external face of the second level of spacers so as to reduce the dielectric permittivity of the second level of spacers.

Advantageously, the first ion implantation and the second ion implantation are based on the same types of ions.

Alternatively, the first ion implantation and the second ion implantation are based on the types of ions that are different from one another.

This allows for two degrees of freedom in the choice of the ions to be implanted, and therefore in the dielectric permittivity of the spacers.

Advantageously, the first ion implantation is carried out after a first step of silicidation of electrical contacts on the gate and/or on the source/drain zone.

According to an embodiment, the first step of silicidation is carried out at a temperature between 300° C. and 700° C., more preferably between 400° C. and 500° C.

Advantageously, the second ion implantation is carried out after a second step of silicidation of electrical contacts on the gate and/or on the source/drain zone.

Advantageously, the second step of silicidation is carried out at a temperature between 300° C. and 700° C., more preferably between 400° C. and 500° C.

Advantageously, the gate pattern is between two spacers forming the first level of spacers, the method comprising a step of removing of the gate pattern in such a way as to define a cavity between the two spacers forming the first level of spacers, and advantageously the first ion implantation is carried out in such a way as to implant at least one internal face of the first level of spacers, said internal face being turned facing said cavity, so as to reduce the dielectric permittivity of the first level of spacers.

Advantageously, said ion implantation is more preferably inclined in the direction of said internal face.

Advantageously, the ion implantation is carried out by plasma at a pressure greater than or equal to 80.

This makes it possible to favor the implantation on the flanks of the structures, in this case it concerns internal faces of the first level of spacers.

Advantageously, the gate pattern is a gate stack formed before the forming of at least one spacer. The gate stack comprises at least one layer of a material of high dielectric permittivity, a layer of a metal material and at least one layer of a compound with a Tungsten base for example.

Advantageously, the gate pattern is removed after the forming of the at least one spacer.

Advantageously, the gate pattern is removed after the forming of the first level of spacers in such a way as to define a cavity between the two spacers forming the first level of spacers and before the forming of a gate stack.

Advantageously, the method comprises, after the forming of the at least one spacer, a step of removing of the gate pattern in such a way as to define a cavity between the two spacers forming the first level of spacers, and comprises, after the step of removing of the gate pattern, a step of forming a gate stack.

Advantageously, the forming of the gate stack comprises at least the deposition of a first layer, of a second layer and of a third layer, and advantageously the first layer comprises a material taken from at least: SiON, HfO2, HfSiON, advantageously the second layer comprises a material taken from at least: TiN, TaN, Ta, and advantageously the third layer comprises a material with a tungsten base.

Advantageously, the first layer comprises a material taken from at least: SiON, HfO2, HfSiON, the second layer comprises a material taken from at least: TiN, TaN, Ta, and the third layer comprises a material with a tungsten base.

Advantageously, said step of forming of the at least one source/drain zone comprises a step of epitaxy of the at least one source/drain zone.

Advantageously, said step of forming of the at least one source/drain zone comprises a step of annealing said stack at a temperature preferably between 600° C. and 1200° C., advantageously between 900° C. and 800° C., and preferably equal to 1050° C.

Advantageously, the at least one spacer comprises at least one non-carbon material taken, more preferably from at least: SiN, BN, SiO2.

Advantageously, in the case of an implantation by plasma in an etching reactor of the capacitive coupling type, the energy of the ions implanted is preferably between 100 eV (electron volt) and 500 eV, and advantageously between 100 eV and 300 eV, and wherein the concentration of implanted ions is preferably between $10^8$ atoms/cm$^3$ and $10^{11}$ atoms/cm$^3$, and advantageously between $10^9$ atoms/cm$^3$ and $10^{10}$ atoms/cm$^3$, and advantageously, in the case of an implantation by high-density plasma, the energy of the ions implanted is preferably between 10 eV and 200 eV, and advantageously between 10 eV and 100 eV, and wherein the concentration of implanted ions is preferably between $10^{10}$ atoms/cm3 and $10^{13}$ atoms/cm3, and advantageously between $10^{11}$ atoms/cm3 and $10^{12}$ atoms/cm3.

Advantageously, in the case of an implantation by plasma in an etching reactor of the capacitive coupling type, the energy of the ions implanted is preferably between 100 eV (electron volt) and 500 eV, and advantageously between 100 eV and 300 eV, and wherein the concentration of implanted ions is preferably between $10^8$ atoms/cm3 and $10^{11}$ atoms/cm$^3$, and advantageously between $10^9$ atoms/cm3 and $10^{10}$ atoms/cm$^3$.

Advantageously, in the case of an implantation by high-density plasma, the energy of the ions implanted is preferably between 10 eV and 200 eV, and advantageously between 10 eV and 100 eV, and wherein the concentration of implanted ions is preferably between $10^{10}$ atoms/cm3 and $10^{13}$ atoms/cm$^3$, and advantageously between $10^{11}$ atoms/cm$^3$ and $10^{12}$ atoms/cm$^3$.

Advantageously, in the case of an implantation by ion beams, the energy of the ions implanted is preferably between a few electron volts and 5 KeV, and advantageously between a few electron volts and 2 KeV, and wherein the concentration of implanted ions is greater than or equal to $10^{12}$ atoms/cm$^3$, and advantageously between $10^{15}$ atoms/cm$^3$ and $10^{16}$ atoms/cm$^3$.

Advantageously, before the forming of the gate pattern, the underlying layer made of semi-conductor material has a hollow between two zones intended to form source/drain zones and comprising at least one step of realizing the gate pattern in such a way that the gate pattern is at least partially located in said hollow.

According to an embodiment, elaborated substrates of the SOI type can be used. The elaborated SOI substrate is characterized by the presence of an underlying layer 30 resting on a continuous insulating layer of oxide 20.

Figure 7:
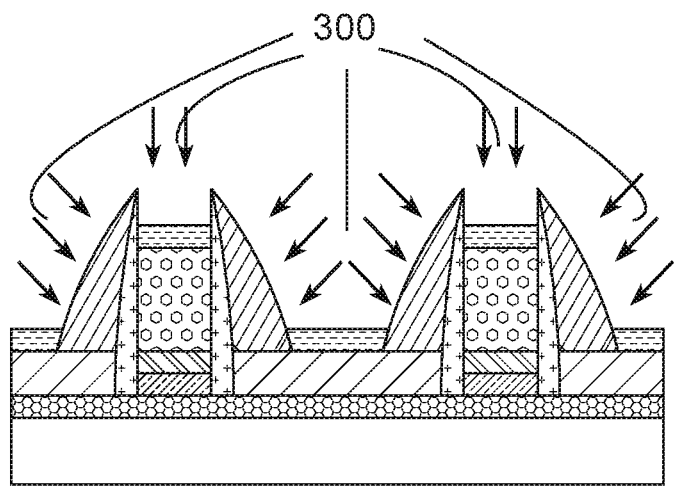
FIG. 7 shows a new additional step in the realization of spacers according to a first embodiment of the invention wherein the gate stack is formed at the beginning of the method.
Figure 19:
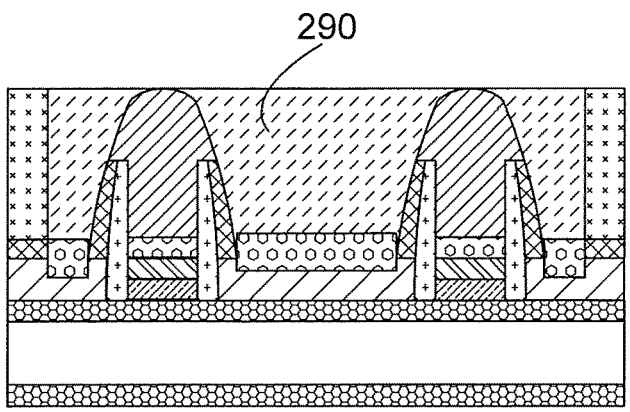
Figure 20:
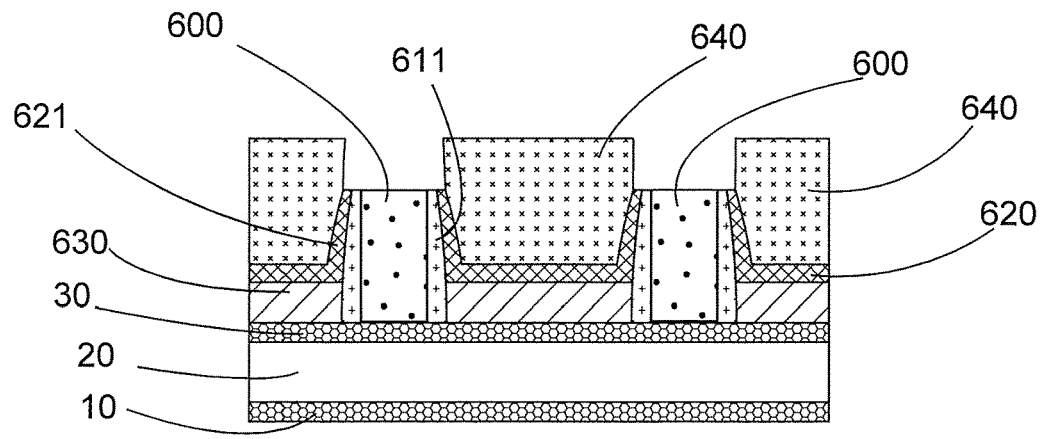
FIGS. 20 to 23 show steps of realizing spacers according to a third embodiment of the invention wherein the gate stack is formed at the end of the method.

FIGS. 7, 19 and 20 show two embodiments and in particular a transistor comprising at least one first level of spacers 111, 211, 611 and at least one second level of spacers 121, 221, 621, the first level of spacers 111, 211, 611 being comprised of at least one first material having a first dielectric permittivity, and the second level of spacers 121, 221, 621 being comprised of at least one second material having a second dielectric permittivity.

The first dielectric permittivity can be identical or different from the second dielectric permittivity. It is understood that one or each one of the spacers 111, 211, 611 and 121, 221, 621 can comprise one or several layers of the same material, or, advantageously, of different materials. As such, the term spacer covers structures that can be complex, i.e., that can be comprised of several portions that differ through the sequence of their formation and/or the materials that comprise them. The expression "different materials" also covers the use of layers of the same nature but having different doping in the nature of dopants and/or in the concentration of dopants. It is specified here that the permittivity of a spacer is a magnitude that can be measured via a measurement of the capacity of the spacer between for example the source and the gate or between the gate and the drain. It is then possible to compare this magnitude between each one of the spacers with a global width equal to the two sides. The permittivity of the spacers can for example be identical or different at least according to a direction of the thickness of the spacers, i.e., perpendicular to the gate.

Using two levels of spacers 111, 211, 611 and 121, 221, 621 having different electrical permittivities makes it possible to have an additional degree of freedom in the design and the realization of transistors. Indeed, it is possible to influence several electrical parameters of the transistor according to the variations of the first and of the second dielectric permittivity of the spacer levels. In addition, cleverly choosing these dielectric parameters makes it possible to improve the performance of the transistor and mainly its dynamic performance.

Moreover, using two levels of spacers 111, 211, 611 and 121, 221, 621 allows for the use of two different geometries: the first spacer level 111, 211 and 611 can for example pass through the epitaxial layer forming the source/drain zone 130, 230 and 630 since it is formed before the forming of the source/drain zones 130, 230 and 630, while the second level of spacers 121, 221 and 621 does not pass through the epitaxial layer of the source/drain zones 130, 230 and 630.

This geometric configuration then takes advantage of this solution allowing for an adjustment of the electrical permittivities of each one of the two levels of spacers 111, 211, 611 and 121, 221, 621.

An embodiment relates to a method of manufacturing a transistor from a stack comprising a gate pattern 100, 200, 600 located above an underlying layer 30 of a semi-conductor material and comprising at least one flank 105, 205, more preferably at least two flanks 105, 205.

Advantageously, according to this embodiment the gate pattern 100, 200 forms a gate 100, 200 with at least several of these functional layers. This is as such a method of the "gate-first" type. While according to another embodiment that will be described in reference to FIGS. 20 to 23, the gate pattern 600 is a sacrificial element removed after the forming of the first level of spacers 611 in such a way as to form a gate 610 after the forming of the first level of spacers 611. This other embodiment is as such of the "gate-last" type.

An embodiment relates to a method for manufacturing said transistor being characterized by the fact that it comprises a plurality of steps.

A step, according to an embodiment, relates to the forming of at least one gate spacer 111, 211, 611, 121, 221, 621 on at least one flank 105, 205 of the gate 100, 200 or of the gate pattern 600 and more preferably on the at least two flanks 105, 205 of the gate 100, 200 or of the gate pattern 600.

Another step, according to an embodiment, relates to the forming of at least one source/drain zone 130, 230, 630 in a peripheral zone 31 surrounding said gate 100, 200 or said gate pattern 600 and located above said underlying layer 30;

After the step of forming the at least one source/drain zone 130, 230, 630, this solution advantageously comprises a step of reducing the dielectric permittivity of the at least one gate spacer 111, 211, 121, 221, 611, 621. Preferably, said step of reducing comprises at least one ion implantation in one portion at least of the thickness of the at least one gate spacer 111, 211, 121, 221, 611, 621.

According to a first embodiment shown in FIGS. 1 to 7, a method is provided for manufacturing at least one transistor having at least two levels of spacers 111 and 121. FIGS. 1 to 6 show steps known in prior art, the step shown by FIG. 7 relates to a new characteristic.

The embodiments also apply in the case where a single level of spacers is considered.

This method comprises at least one step of reducing the dielectric permittivity of the spacers 111 and/or 121.

According to an embodiment, this method can include the following steps:

a) Forming of the gate stack 100;

b) Deposition of a first dielectric layer in such a way as to cover at least the flanks of the gate 100;

c) Forming of the first level of spacers 111 by etching the first dielectric layer;

d) Cleaning of the surfaces 31 of the underlying layer 30;

e) Forming of the source/drain zones 130 by epitaxy from the semi-conductor layer 30;

f) Doping of the source/drain zones 130, then annealing at 1050° C.;

g) Removing the hard mask 104;

h) Deposition of a second dielectric layer in such a way as to cover at least the first level of spacers 111;

i) Forming of the second level of spacers 121 by etching the second dielectric layer;

j) Silicidation in such a way as to allow for the forming of electrical contacts 150 on the gate 100 and source/drain zones 130;

k) Reducing of the dielectric permittivity of the spacers by ion implantation within at least one among the first and the second level of spacers 111, 121.

FIG. 1 shows two gate stacks 100 on an underlying layer 30 resting on a BOX 20.

In this FIG. 1, used as a typical example of a starting point for an application of the method described, the gate 100 is conventionally comprised of a stack of layers described hereinafter of which a large portion is always comprised of polycrystalline silicon 103.

A currently commonly-used technique consists in manufacturing the integrated circuits by using elaborated substrates of the SOI type. In the structure of FIG. 1 is found a portion of the layers comprising this type of substrate. That is to say: a thin surface layer, called an underlying layer, of monocrystalline silicon, of Germanium or of Silicon-Germanium 30 resting on a continuous insulating layer of oxide, referred to as BOX, 20. The layer that comprises the bulk of the SOI substrate is not shown in FIG. 1.

According to a preferred embodiment, the gate 100 is carried out by a conventional technique such as for example by plasma etching.

The gate 100 comprises, in the case of FIG. 1, several layers (101, 102, 103, 104):

The layer 101 is a layer comprising at least one dielectric material with high permittivity taken from among at least: SiON, HfO2, HfSiON. This layer is usually qualified as "high-k" due to its high dielectric permittivity, typically greater than 4.

The layer 102 is a layer comprising at least one metal taken from at least: TiN, TaN, Ta.

The layer 103 is preferentially made of polycrystalline silicon.

The layer 104 is a hard mask, preferentially made of silicon nitride.

The gate 100 can advantageously be carried out by conventional microelectronics techniques.

Figure 2:
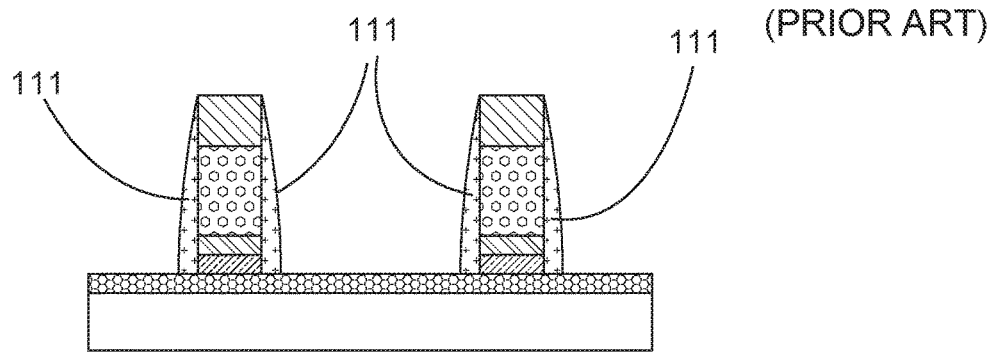

Using this structure, FIG. 2 shows the forming, generally with a step of deposition, of a first dielectric layer which will in what follows form the first level of spacers 111.

This first dielectric layer advantageously comprises at least one material taken from: silicon nitride, boron nitride, SiO2, and more generally any non-carbon material.

This can for example be an oxide or nitride with a silicon base. The forming of this first dielectric layer can include a treatment, in addition to the creating of the layer properly speaking. For example, a phase of oxidation via plasma treatment is possible, as well as a phase of cleaning, wet for example.

According to a non-limiting example, a so called "conformal" deposition is carried out of the first dielectric layer over a thickness for example ranging from 1 nm to 30 nm, advantageously ranging from 5 nm to 15 nm, and more preferably equal to 10 nm. Generally, this value depends on the technology node considered. The deposition is conformal if it is carried out equally regardless of the orientation of the surfaces whereon it is carried out. In order to obtain this result the deposition is, according to a non-limiting example, carried out using a method referred to as PECVD (acronym for "plasma-enhanced chemical vapor deposition", or a method referred to as LPCVD (acronym for "low-pressure chemical vapor deposition", or an ALD method (acronym for "atomic layer deposition) or a PEALD method (acronym for "Plasma-Enhanced Atomic Layer Deposition". At the end of this step, the first dielectric layer deposited is of a substantially equal thickness on the flanks of the gate 100 and on the horizontal portions, i.e. those parallel to the plane of the substrate.

Once this first deposition is carried out, a step of etching shown in FIG. 2 is carried out in order to leave the first dielectric layer advantageously only on the flanks of the gate 100.

Said etching can, according to a non-limiting example, be an anisotropic etching of the first dielectric layer, i.e. a substantially vertical etching of the first dielectric layer deposited, etching which is therefore carried out perpendicularly to the plane of the substrate and which does not etch, or etches very little, the flanks of the gate. This type of etching is advantageously carried out using a plasma in an etching reactor of the capacitive coupling type (CCP) or inductive coupling (ICP) and more preferably in a reactor of the latter type. The conditions of such an anisotropic etching are for example those for an inductive coupling reactor: pressure=5 milli Torr; power of the source=300 Watts; polarization voltage=65 Volts; trifluoromethane flow rate (CHF3)=30 sccm (cubic centimeters per minute); helium flow rate (He)=220 sccm; temperature of the substrate holder (for example electrostatic)=110° C. In these conditions, the etching speed of the silicon nitride, the standard material used for the forming of the spacers, is then about 32 nm per minute.

Equivalently, an embodiment can include an isotropic, wet or dry etching.

The method of etching is according to the materials considered that comprise the first dielectric layer. Advantageously, this step of etching can be carried out by a fluorine carbon chemical etching.

Preferentially, a preliminary step of oxidation of the first dielectric layer an be carried out in order to obtain better control of the sizing of the first level of spacers 111 during the etching. For example, the nitride on the surface can be oxidized. Indeed, the chemistry used, for example, can be oxide selective, the ionic bombardment of plasma then consumes the oxide nitride on the planar portions, while the oxide is still retained on the flanks. This technique then allows for anisotropic etching.

This step of etching is preferentially carried out in such a way as to leave the flanks of the gate 100 covered with the first dielectric layer in order to form the first level of spacers 111 of the gate 100.

Advantageously, this etching is configured to retain the dimensional of the spacers 111, i.e. their original thickness for example, as well as a stopping of the etching on the underlying layer 30. In order to control this etching and prevent the consumption of the underlying 30, the selectivity is preferentially between 10 and 50, advantageously between 20 and 40 and more preferably equal to 30.

Advantageously, a step of cleaning follows this step of etching. This cleaning is more preferably carried out by wet treatment with a hydrofluoric acid chemical base.

Figure 3:
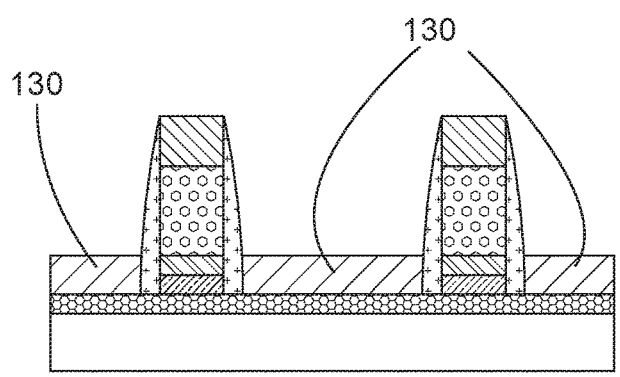

According to a preferred embodiment and shown in FIG. 3, the following step concerns the forming of source/drain zones 130 on the surfaces 31 of the underlying layer 30.

Advantageously, this forming comprises a step of cleaning of the surfaces 31. This step of cleaning can for example be carried out by wet treatment, with for example a hydrofluoric acid base with or without hydrochloric acid.

According to a non-limiting embodiment, the forming of the source/drain zones 130 comprises an epitaxial growth of a material on the surfaces 31 of the underlying layer 30, i.e. on the peripheral zones 31 surrounding the gate 100.

Advantageously, the source/drain zones 130 are formed by epitaxy of a semi-conductor material, for example silicon (Si), germanium (Ge), silicon-germanium (SiGe), on the surfaces 31 of the underlying layer 30. In order to form the source and the drain, a step of doping, by ion implantation for example, can be carried out at the same time or after the epitaxial growth of the source/drain zones 130. This step of forming the source/drain zones 130 is not specific to this embodiment and can be carried out by any technique known in prior art. It is generally carried out at a temperature between 500° C. and 800° C.

According to another embodiment, the source/drain zones are not obtained by epitaxy. They can be formed in the semi-conductor layer. The gate stack is then formed in a hollow carried out between the source/drain zones. This embodiment is widely used in the case where the semi-conductor layer is thick (methods called "bulk").

Preferentially, regardless of the mode of realizing the source/drain zones 130, the implantation of dopants in these zones is generally carried out. Then, a step of annealing, at a temperature of about 1050° C. for example, can be carried out after the forming of the source/drain zones 130, after doping of the latter, in such a way as to allow for the activation of the dopants. This type of annealing is usually designated as "activation annealing".

Figure 4:
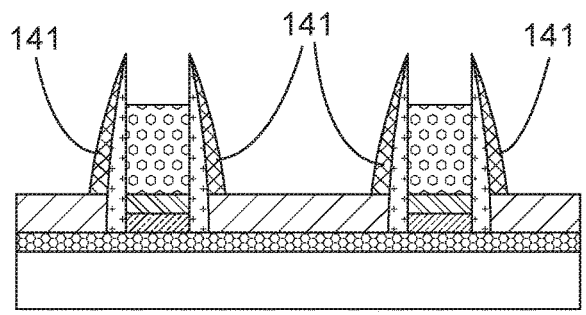

The following step is shown in FIG. 4. It consists in the forming of an encapsulating layer 141 of the first level of spacers 111. This step advantageously comprises the forming of a silicon oxide layer and/or of any material that can allow for a protection of the first level of spacers with regards to the following steps. This deposition of an oxide layer, for example, may or may not be conformal. This deposition is followed by a step of etching in such a way as to leave this layer solely on the flanks of the first level of spacers 111 in such a way as to form the encapsulating layer 141.

Preferably, this encapsulating layer 141 is formed above at least a portion of the source/drain zones 130. This step is not specific to this embodiment and can be carried out by any technique known in prior art.

This step is then preferentially followed by a step of removing of the hard mask made of nitride 104. Advantageously this removing is carried out by etching H3PO4. Here again this step is not specific to this embodiment and can be carried out by any technique known in prior art.

Advantageously, the encapsulating layer 141 makes it possible to protect the first level of spacers 111 when the hard mask 104 is removed.

According to an embodiment, the removing of the hard mask 104 is followed by a step of removing the encapsulating layer 141.

According to another embodiment in which it is not desired to remove the hard mask 104, the encapsulating layer 141 is not formed on purpose, but a very thin oxide layer can be formed naturally on the first level of spacers 111, in this case, this very thin oxide layer can be retained in the later steps.

Figure 5:
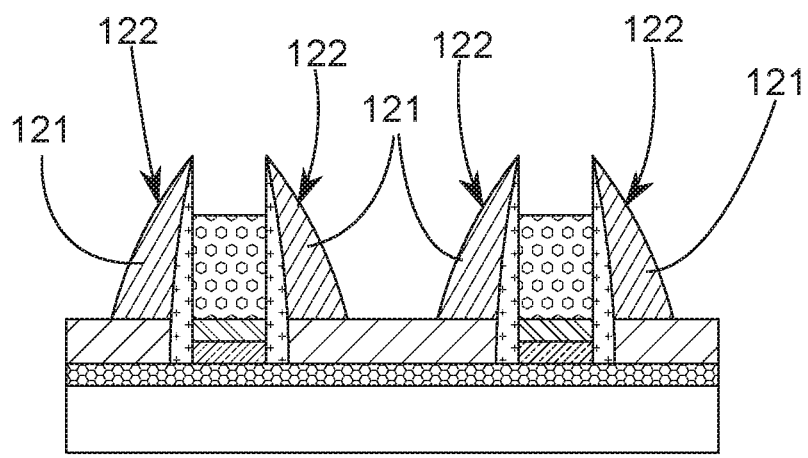

FIG. 5 shows the following step consisting in the forming of a second level of spacers 121. In a manner identical to the forming of the first level of spacers 111, this step comprises a step of depositing a second dielectric layer which will subsequently form the second level of spacers 121.

According to an embodiment, the second dielectric layer comprises at least one material that can be identical or different from the material comprising the first dielectric layer that was used to form the first level of spacers 111.

This dielectric layer advantageously comprises at least one material taken from: silicon nitride, $SiO_2$.

It can for example be oxide or nitride, in particular silicon. The forming of this second dielectric layer forming this second level of spacers 121 can include a treatment, in addition to the creating of the layer properly speaking. For example, a phase of oxidation via plasma treatment is possible, as well as a phase for cleaning, wet for example.

According to a non-limiting example, a conformal deposition is carried out of the second dielectric layer over a thickness for example ranging from 1 nm to 30 nm, advantageously ranging from 5 nm to 15 nm, and more preferably equal to 10 nm. Here again, this value depends on the technology node considered. This deposition can also be, according to a non-limiting example, carried out with a PECVD method or with a LPCVD method, or a ALD method, or a PEALD method. At the end of this step, the second dielectric layer deposited is of a substantially equal thickness on the flanks of the first level of spacers 111 and on the horizontal portions, i.e. those parallel to the plane of the substrate.

Once this second deposition is carried out, a step of etching shown in FIG. 5 is carried out in order to leave the second dielectric layer advantageously only on the flanks of the first level of spacers 111.

According to a preferred embodiment, all of the steps, all of the conditions for forming as well as the associated advantages indicated for the forming of the first spacer level 111 can be transposed for the forming of the second level of spacers 121.

As such, this step of etching is preferentially carried out in such a way as to leave the first level of spacers 111 covered with the second dielectric layer so as to form the second level of spacers 121 of the gate 100.

Advantageously, a step of cleaning follows this step of etching. This cleaning is preferably carried out by wet treatment with a hydrofluoric acid chemical base.

Figure 6:
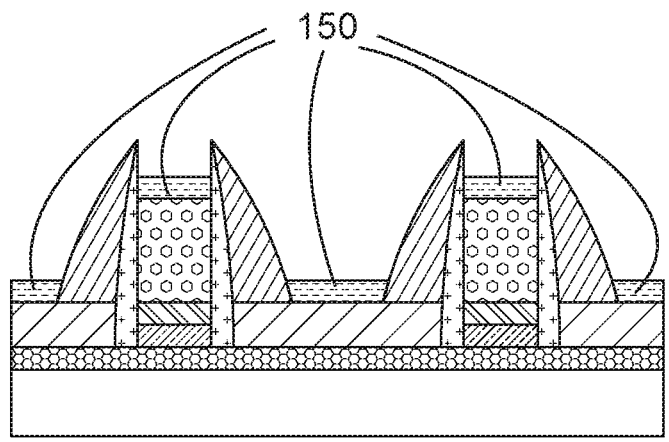

FIG. 6 shows a step of silicidation allowing for the resuming of electrical contacts 150 on the source/drain zones 130 and on the gate 100. According to an embodiment, this silicidation comprises at least one step of depositing a metal layer, for example Ni, NiCo, NiPt.

This step of silicidation can also comprise a step of annealing at a temperature of about 400° C. for example, and more generally between 300° C. and 500° C.

This step can, according to an embodiment, be followed or not by a step of wet cleaning or not. In the case of a wet cleaning, a solution with a peroxymonosulphuric acid base can be used.

The step shown in FIG. 7 relates to a particularly advantageous characteristic. As indicated hereinabove, it is substantially advantageous for this type of technology to have spacers that have a low dielectric permittivity. For this, prior art proposes various solutions making it possible to form the spacers with low dielectric permittivity at the same time as the steps of forming the spacers. However, many steps described hereinabove result in an increase in the dielectric permittivity of the spacers comprising materials with low dielectric permittivity. This is, for example, the step of epitaxy carried out under a high temperature, steps of etching the spacers, steps of cleaning, and of annealing. All of these steps can result in an increase in the dielectric permittivity of the spacers when the latter are formed from materials with low dielectric permittivity.

An embodiment, as is shown in FIG. 7, has an innovative solution in order to overcome this problem. This solution consists in the adding of a step to the method described hereinabove. This step consists in reducing the dielectric permittivity of the second level of spacers 121 after the forming for example of the source and of the drain, and in particular after the growth by epitaxy of the source/drain zones 130.

According to an embodiment, this step is carried out by ion implantation 300 in one portion at least of the thickness of the second level of spacers 121. More precisely and according to an embodiment, this step is carried out by ion implantation 300 on the external faces 122 of the second level of spacers 121.

During this ion implantation the second level of spacers 121 does not cover the zones intended to form the source and drain.

During this ion implantation the second level of spacers 121 is present only on the gate pattern. It covers only the gate pattern and covers more preferably only the flanks of the gate pattern.

According to an embodiment the ionic species implanted are taken from at least: Hydrogen, Helium.

The ion implantation 300 of these species in a portion at least of the second level of spacers 121 allows for a reduction in its dielectric permittivity.

For example, for a second level of spacers 121 having a dielectric permittivity equal to 8 before reduction, the implantation 300 of Helium ions makes it possible to reduce it to 6, and the implantation of hydrogen ions makes it possible to reach a dielectric permittivity equal to 3.7.

As this step is carried out after the main steps that are harmful to the low dielectric permittivity of the spacers, this low value of dielectric permittivity is retained at the end of the manufacturing of the transistor according to this solution. Indeed, the desorption of the ions implanted during the steps of annealing for example is prevented.

According to an embodiment, the ion implantation 300 is carried out by ion beam, more preferably inclined in such a way as to mostly implant the external faces 122 of the second level of spacers 121.

According to a preferred embodiment, the ion implantation 300 is carried out by an implantation plasma, more preferably isotropic.

Advantageously, this implantation plasma is carried out at a pressure greater than or equal to 80 in such a way as to favor the implantation of the ions in the direction of the external faces 122 of the second level of spacers 121. Indeed this high pressure tends to concentrate towards the spacers the ions of the plasma. Using a high pressure has for consequence to have more collisions between the ions, which makes it possible to deviate the ions from their isotropic path in such a way as to increase the isotropy of their path. The pressure is indeed a main factor for having an isotropic modification.

The implantation carried out using a plasma comprising said ions, with a hydrogen base for example, has for advantage to allow for an implantation continuously in a volume extending from the surface of the implanted layer.

According to a non-limiting example, the ion implantation 300 can be carried out as follows: the ion implantation is carried out in any type of implanter or etching machine, and preferably in an ICP or CCP etching chamber, the plasma can for example be a so-called high-density plasma. In order to implant between 1 and a few tens of nanometers, the following parameters can be applied for an implantation using a plasma:

Hydrogen based chemistry, for example;
Power of the source preferably between 100 W and 2000 W, and advantageously between 500 and 1000 Watts;
Polarization voltage preferably between 20V and 1000V, and advantageously between 20 Volt and 500 Volt;
Pressure more preferably greater than 80 mTorr, and advantageously 100 mTorr, allowing for good implantation isotropy;
Temperature preferably between 10° C. and 100° C., and advantageously between 30° C. and 60° C.;
H2 flow rate more preferably between 10 and 500 and advantageously between 10 and 250 sccm;
He flow rate more preferably between 10 and 500 and advantageously between 10 and 250 sccm;
CH4 flow rate more preferably between 5 and 15 and advantageously between 5 and 7 sccm;
Implantation time between a few seconds and several hundreds of seconds;

Advantageously, the previously mentioned implantation conditions depend on the depth to be implanted.

Advantageously, the ion implantation by plasma is carried out at a high pressure, greater than 80, in order to favor the implantation of ions on the flanks of the spacer levels.

Advantageously, the pressure allows for a control on the anisotropy of the ion implantation.

For example, non-limiting, the conditions of such an ion implantation 300 are for an inductive coupling reactor: pressure=10 milli Torr; power of the source=250 Watts; polarization voltage=250 Volts; trifluoromethane flow rate (CH4)=10 sccm (cubic centimeters per minute); helium flow rate (He)=250 sccm.

This step of ion implantation 300 as such allows for the reduction of the dielectric permittivity of the second level of spacers 121 after the step of forming source/drain zones 130 in such a way that this step of forming in particular cannot harm the low dielectric permittivity of the spacers of the gate 100.

This last step is both simple in the realization thereof and clever as it occurs only at the end of the method and does not necessarily require another device in order to carry it out.

According to a second embodiment shown in FIGS. 8 to 19, the step of reducing the dielectric permittivity of the spacers of the gate can comprise a step of ion implantation 400, 500, even two steps of ion implantations 400 and 500. This second embodiment shall now be described, preferentially suited for the case of self-aligned-contacts.

According to an embodiment, this method can include the following steps:

a) Forming of the gate pattern 200 corresponding in this embodiment to a gate stack 200;
b) Deposition of a first dielectric layer in such a way as to cover at least the flanks of the gate 200;
c) Forming of the first level of spacers 211 by etching the first dielectric layer;
d) Cleaning of the surfaces 31 of the underlying layer 30;
e) Forming of the source/drain zones 230;
f) Forming of a second dielectric layer 220 in such a way as to cover at least the flanks of the first level of spacers 211 of the gate 200;
g) Forming of a first encapsulating layer 240;
h) Removing the encapsulating layer 240 and the first dielectric layer at the level of the gate 200 and removing of the hard mask 203;
i) Removing a portion of the polycrystalline silicon layer 202 of the gate 200 and retaining of the two levels of spacers 211 and 221;
j) First silicidation in such a way as to allow for the forming of electrical contacts 250 on the gate 200;
k) Reducing of the dielectric permittivity of the first level of spacers 211 by ion implantation 400 on the internal faces 212 of the first spacer level 211; As such during this ion implantation the implanted spacer is not present on the source/drain zones. More preferably it is present only on the gate pattern.
l) Forming of a capping deposition 260, in particular by filling the cavity 213 defined by the spacers;
m) Partial removing of the first encapsulating layer 240;
n) Forming of the second level of spacers 221 by etching the second dielectric layer 220 outside of the flanks of the gate 200 in such a way as to expose at least partially the source/drain zones 230;

o) Second silication in such a way as to allow for the forming of electrical contacts 280 on at least a portion of the source/drain zones 230;

p) Reducing of the dielectric permittivity of the second level of spacers 221 by ion implantation 500 on the external faces 222 of the second level of spacers 221. As such during this ion implantation the implanted spacer is not present on the source/drain zones. Preferably it covers only the gate pattern. Preferably it covers only the flanks of the gate pattern.

q) Deposition of a second encapsulating layer 290.

As shall be described in what follows, according to an embodiment one only of the steps k) and p) of reducing the dielectric permittivity can be carried out, or both of them according to another embodiment. This possibility of having two steps of reducing the dielectric permittivity separate from one another and concerning different spacer levels confers an additional degree of freedom as to the adjustment of the dielectric permittivities of each one of the spacers so as to respond to precise technological needs.

Figure 8:
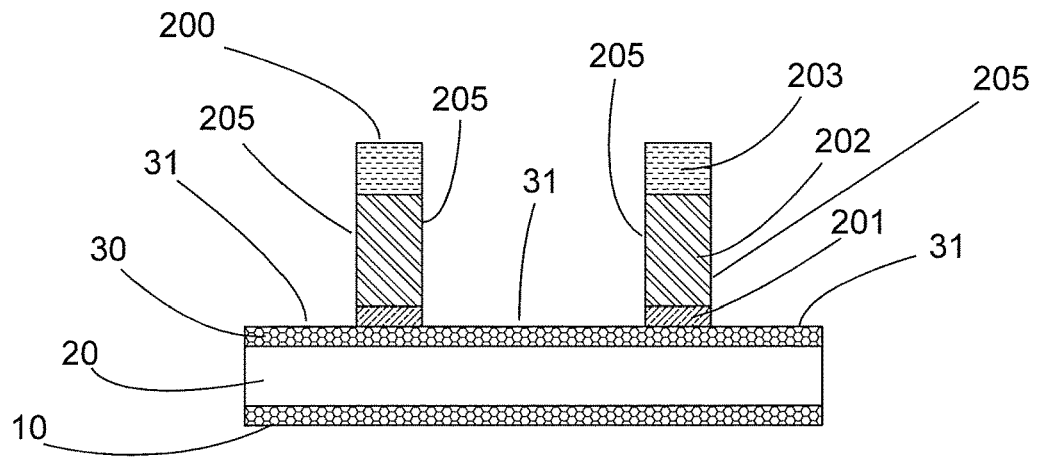
FIGS. 8 to 19 show steps of realizing spacers according to a second embodiment of the invention.

FIG. 8 shows two gate stacks 200 on an underlying layer 30 resting on a BOX 20 present on a substrate 10.

Figure 9:
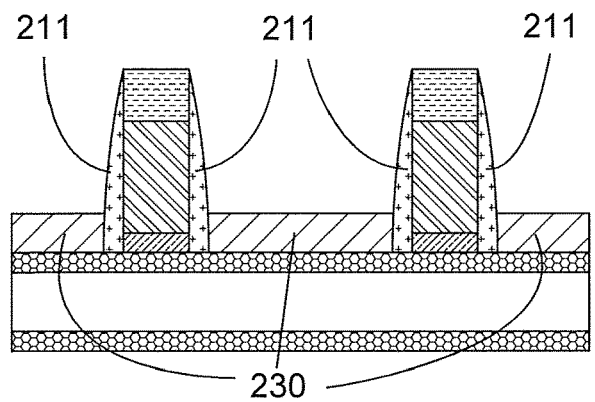

FIGS. 8 and 9 correspond to FIGS. 1 to 3 shown hereinabove. All of the steps, characteristics, examples of realization and advantages mentioned in reference to the embodiment shown in FIGS. 1 to 3 apply to the embodiment shown in FIGS. 8 and 9.

Figure 10:
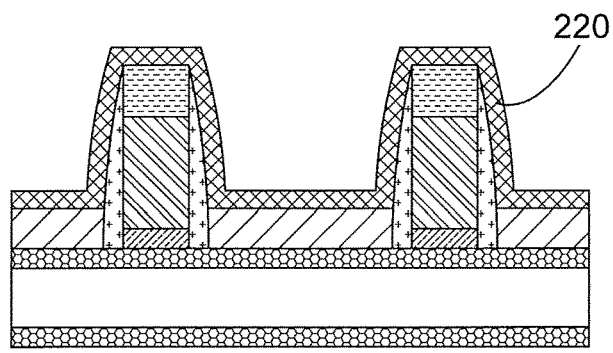

FIG. 10 shows the forming, generally with a step of deposition, of a second dielectric layer 220 which will in what follows form the second level of spacers 221.

According to an embodiment, the second dielectric layer 220 comprises at least one material which can be identical or different from the material comprising the first dielectric layer that was used to form the first level of spacers 211.

This dielectric layer 220 advantageously comprises at least one material taken from: silicon nitride, SiO2.

It can for example be oxide or nitride, in particular silicon. The forming of this second dielectric layer 220 forming this second level of spacers 221 can include a treatment, in addition to the creating of the layer properly speaking. For example, a phase of oxidation via plasma treatment is possible, as well as a phase for cleaning, wet for example.

According to a non-limiting example, a conformal deposition is carried out of the second dielectric layer 220 over a thickness for example ranging from 1 nm to 30 nm, advantageously ranging from 5 nm to 15 nm, and more preferably equal to 10 nm. Here again, this value depends on the technology node considered. This deposition can also be, according to a non-limiting example, carried out with a PECVD method or with a LPCVD method, or a ALD method, or a PEALD method. At the end of this step, the second dielectric layer 220 deposited is of a substantially equal thickness on the flanks of the first level of spacers 211 of the gate 200 and on the horizontal portions, i.e. those parallel to the plane of the substrate.

Figure 11:
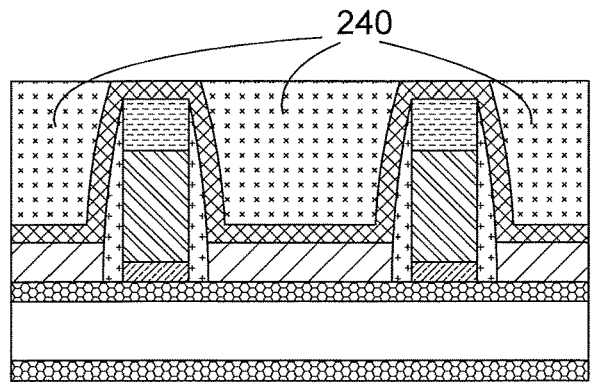

FIG. 11 shows the forming of a first encapsulating layer 240. This first encapsulating layer 240 advantageously comprises an oxide.

The thickness of the first encapsulating layer 240 is preferably between 50 nm and 200 nm, advantageously between 50 nm and 150 nm and more preferably equal to 100 nm.

Advantageously, the deposition of this layer 240 is carried out in such a way as to fill the spaces separating the gates 200 as shown in FIG. 11.

The deposition of the first encapsulating layer 240 is for example carried out by a technique taken from at least: PEALD, PECVD, LPCVD, ALD, SACVD (acronym for "Sub-Atmospheric Pressure Chemical Vapor Deposition").

This oxidation is followed by a step of "mechanical-chemical" polishing, of the so-called CMP type, acronym for "chemical mechanical polishing". An operation which is possibly followed by a fine chemical polishing. The purpose of this operation is to render the surface of the layer 240 flat. The technique used for the chemical mechanical polishing can be that described in chapter 14.2 of the work "Handbook of Cleaning for Semiconductor Manufacturing", 2011, Ed. Wiley. For this purpose, a thickness of the layer 240 is removed. The surface is then cleaned in order to eliminate the polishing residue (abrasive particles and polishing liquid generally designated by the name "slurry").

This step of polishing is carried out in such a way as to expose a portion at least of the dielectric layer 220 as shown in FIG. 11. Advantageously, the portion of the layer 220 exposed corresponds to the portion covering the top of the gate 200.

According to an embodiment, this step can be carried out until the exposing of the hard mask 203 of the gate 200.

Figure 12:
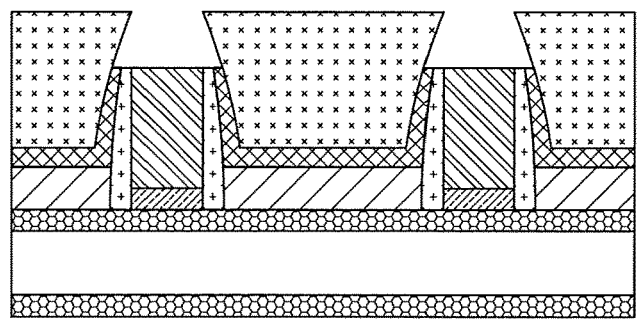
Figure 13:
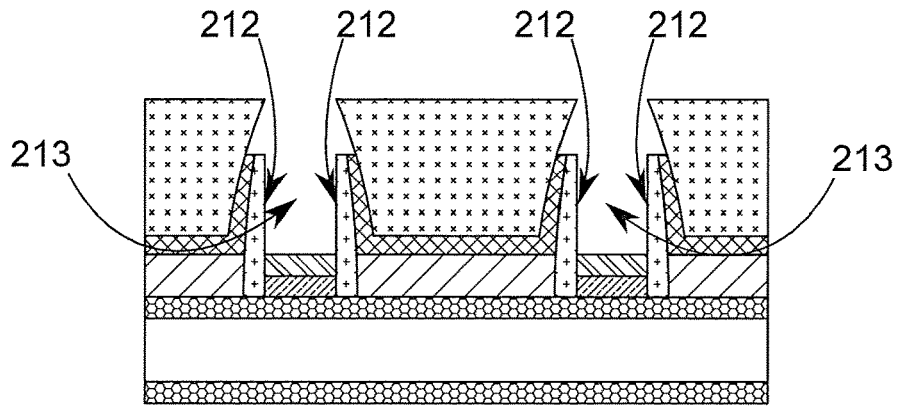

The following step is shown in FIGS. 12 and 13, it consists in the removing of a portion at least of the dielectric layer 220, of a portion at least of the first level of spacers 211, of the hard mask 203 of the gate 200 and of a portion at least of the polycrystalline silicon layer 202 in such a way as to form a cavity 213. Advantageously this removing is carried out by etching. Relating to the removing of a portion at least of the layer 202, the latter is advantageously carried out by wet etching. Here again this step is not specific to this embodiment and can be carried out by any technique known in prior art.

Advantageously, this step of removing is carried out in such a way as to define a cavity 213 between the two spacers forming the first level of spacers 211.

Figure 14:
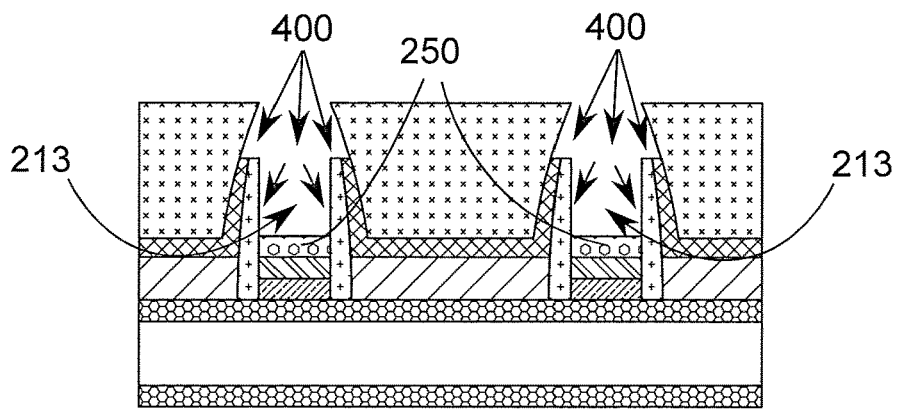

The following step, shown in FIG. 14, relates to a first silication of a portion at least of the layer 202.

Advantageously, it entails the silication of a portion at least of the residual layer 202 subsequent to the partial removing thereof of the preceding step.

This first silication allows for the resuming of electrical contacts 250 on the gate 200 at the bottom of the cavity 213 defined between the two spacers forming the first level of spacers. This step of silication is advantageously carried out in such way as to retain a portion at least of said cavity 213. According to an embodiment, this silication comprises at least one step of depositing a metal layer, for example Ni, NiCo, NiPt.

This step of silication can also comprise a step of annealing at a temperature of about 400° C. for example, and more generally between 300° C. and 500° C.

This step can, according to an embodiment, be followed or not by a step of cleaning, wet or not. In the case of a wet cleaning, a solution with a peroxymonosulphuric acid base can be used.

FIG. 14 also shows a particularly advantageous characteristic. This figure has a step consisting in the reducing of the dielectric permittivity of the first level of spacers 211 after the forming for example of the source and of the drain by epitaxy.

According to an embodiment, this step is carried out by ion implantation 400 in one portion at least of the thickness of the first level of spacers 211. More precisely and according to an embodiment, this step is carried out by ion implantation 400 on the internal faces 212 of the first level of spacers 211, said internal faces 212 being turned facing said cavity 213.

According to an embodiment, this ion implantation 400 is more preferably inclined in the direction of said internal faces 212.

According to an embodiment the ionic species implanted are taken from at least: Hydrogen, Helium.

The ion implantation 400 of these species in a portion at least of the first level of spacers 211 allows for a reduction in its dielectric permittivity.

For example, for a first level of spacers 211 having a dielectric permittivity equal to 8 before reduction, the implantation 300 of Helium ions makes it possible to reduce it to 6, and the implantation of hydrogen ions makes it possible to reach a dielectric permittivity equal to 3.7.

As this step is carried out after the main steps that are harmful to the low dielectric permittivity of the spacers (epitaxy, wet cleaning, silicidation, etc.), this low value of dielectric permittivity is retained at the end of the manufacturing of the transistor. Indeed, the desorption of the ions implanted during the steps of annealing for example is prevented.

According to an embodiment, the ion implantation 400 is carried out by ion beam, more preferably inclined (tilted) in such a way as to mostly implant the internal faces 212 of the first level of spacers 211.

According to another embodiment, the ion implantation 400 is carried out by a plasma implantation, more preferably isotropic.

Advantageously, this implantation plasma is carried out at a pressure greater than or equal to 80 in such a way as to favor the implantation of the ions on the internal faces 212 of the first level of spacers 211.

The implantation carried out using a plasma comprising said ions, with a hydrogen base for example, has for advantage to allow for an implantation continuously in a volume extending from the surface of the implanted layer.

All of the steps, characteristics, examples of realization and advantages mentioned in reference to the embodiment shown in FIG. 7 apply to the embodiment shown in FIG. 14.

Figure 15:
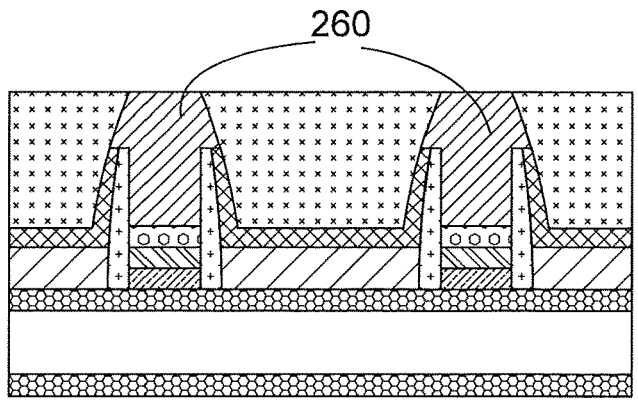

The following step is shown in FIG. 15 and relates to the forming of a deposition of the capping type 260. The term capping deposition is used in the case of a deposition used to fill an interstice for example. This deposition is shown perfectly in FIG. 15. The capping 260 formed as such fills the interstice left vacant by the preceding step of removing a portion of the layer 202 of the gate 200.

Advantageously, this deposition has a silicon nitride base.

According to a preferred embodiment this capping 260 covers at least partially the electrical contact 250 and/or at least one portion of the first and/or second level of spacers 211, 221.

The thickness of the capping 260 is preferably between 20 nm and 50 nm, advantageously between 30 nm and 40 nm.

The deposition of this capping 260 is for example carried out by a technique taken from at least: PECVD, HDPCVD (acronym for "High Density Plasma Chemical Vapor Deposition").

Figure 16:
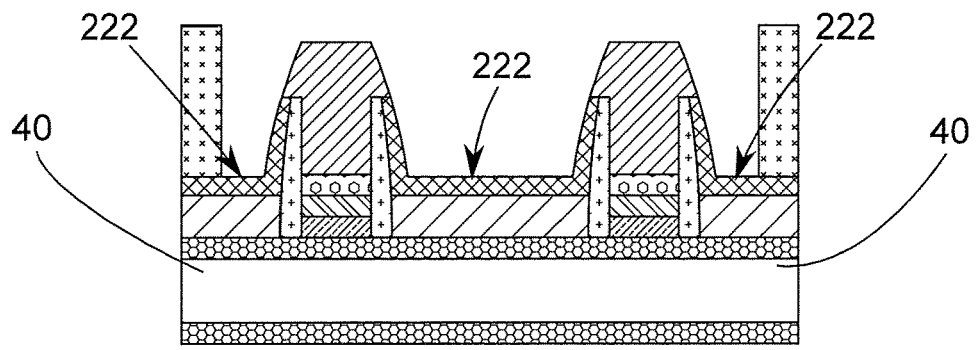

The following step, still shown in FIG. 16, also relates to the partial removing of the first encapsulating layer 240 on the surfaces 222 of the dielectric layer 220 in such a way as to expose the external faces 222 of the second level of spacers 221. Advantageously this partial removal is carried out by plasma etching. Here again this step is not specific to this embodiment and can be carried out by any technique known in prior art.

Advantageously, this etching is selective using differences between the layers of nitride 221, 260 and the oxide layer 240.

Figure 17:
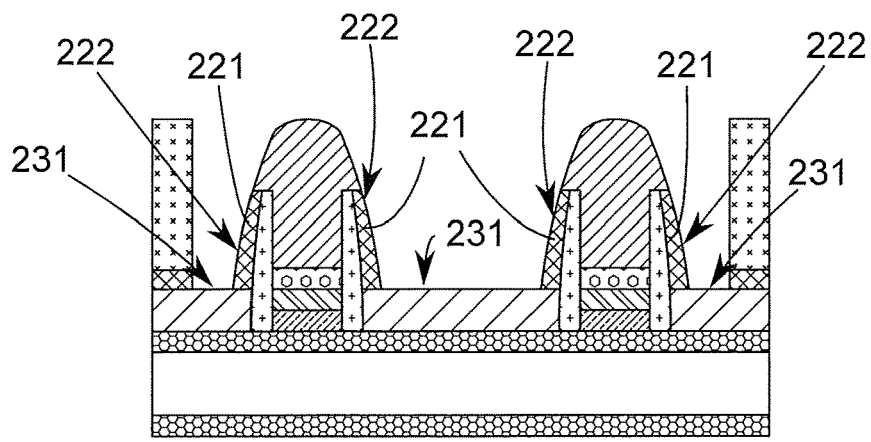

The following step is shown in FIG. 17 and allows for the forming of the second level of spacers 221. This step comprises at least one etching carried out in order to leave the second dielectric layer 220 advantageously only on the first level of spacers 211.

All of the steps, characteristics, examples of realization and advantages mentioned in reference to the embodiment shown in FIG. 5 apply to the embodiment shown in FIG. 17.

This step of etching is preferentially carried out in such a way as to leave the first level of spacers 211 covered with the dielectric layer 220 in order to form the second level of spacers 221 of the gate 200.

Advantageously, a step of cleaning follows this step of etching. This cleaning is more preferably carried out by wet treatment with a hydrofluoric acid chemical base.

Figure 18:
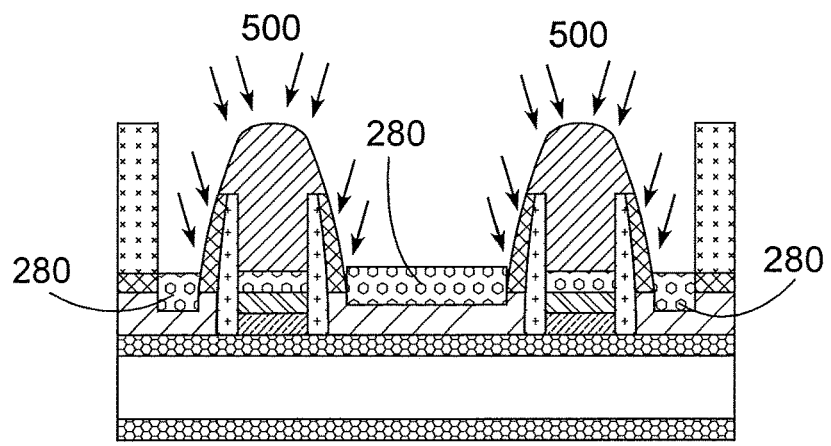

The following step, shown in FIG. 18, relates to a second silicidation of a portion at least of the layer forming the source/drain zone 230.

Advantageously, this entails the silicidation of a portion at least of the layer forming the source/drain zone 230, on the surfaces 231.

This second silicidation allows for the resuming of electrical contacts 280 on the source/drain zone 230.

According to an embodiment, this silicidation comprises at least one step of depositing a metal layer, for example Ni, NiCo, NiPt.

This step of silicidation can also comprise a step of annealing at a temperature of about 400° C. for example, and more generally between 300° C. and 500° C.

This step can, according to an embodiment, be followed or not by a step of cleaning, wet or not. In the case of a wet cleaning, a solution with a peroxymonosulphuric acid base can be used.

FIG. 18 also shows a particularly advantageous characteristic, the reducing of the dielectric permittivity of the second level of spacers 221.

According to an embodiment, this step is carried out by ion implantation 500 in one portion at least of the thickness of the second level of spacers 221. More precisely and according to an embodiment, this step is carried out by ion implantation 500 on the external faces 222 of the second level of spacers 221.

According to an embodiment the ionic species implanted are taken from at least: Hydrogen, Helium.

The ion implantation 500 of these species in a portion at least of the second level of spacers 221 allows for a reduction in its dielectric permittivity.

For example, for a second level of spacers 211 having a dielectric permittivity equal to 8 before reduction, the implantation 500 of Helium ions makes it possible to reduce it to 6, and the implantation of hydrogen ions makes it possible to reach a dielectric permittivity equal to 3.7.

As this step is carried out after the main steps that are harmful to the low dielectric permittivity of the spacers (epitaxy, wet cleaning, silicidation, etc.), this low value of dielectric permittivity is retained at the end of the manufacturing of the transistor. Indeed, the desorption of the ions implanted during the steps of annealing for example is prevented.

According to an embodiment, the ion implantation 500 is carried out by ion beam, more preferably inclined in such a way as to mostly implant the external faces 222 of the second level of spacers 221.

According to a preferred embodiment, the ion implantation 500 is carried out by a plasma implantation, more preferably isotropic.

Advantageously, this implantation plasma is carried out at a pressure greater than or equal to 80 in such a way as to favor the implantation of the ions on the external faces 222 of the second level of spacers 221.

The implantation carried out using a plasma comprising said ions, with a hydrogen base for example, has for advantage to allow for an implantation continuously in a volume extending from the surface of the implanted layer.

All of the steps, characteristics, examples of realization and advantages mentioned in reference to the embodiment shown in FIG. 7 and in FIG. 14 apply to the embodiment shown in FIG. 18.

This step of ion implantation 500 as such allows for the reduction of the dielectric permittivity of the second level of spacers 221 after the step of forming source/drain zones 230 in such a way that this step of forming in particular cannot harm the low dielectric permittivity of the spacers of the gate 200.

FIG. 19 shows the forming of a second encapsulating layer 290. This second encapsulating layer 240 advantageously comprises at least one material taken from: TiN, W.

According to a preferred embodiment, the second encapsulating layer 290 comprises a metal.

Advantageously this second encapsulating layer 290 comprises a first layer referred to as cladding comprising TiN and a second metal layer comprising W. This encapsulating layer 290 as such allows for the resuming of the electrical contacts on contacts 280.

The thickness of the second encapsulating layer 290 is preferably between 30 nm and 200 nm, advantageously between 50 nm and 100 nm.

Advantageously, the deposition of this layer 290 is carried out in such a way as to fill the spaces separating the gates 200 as shown in FIG. 19.

The deposition of the second encapsulating layer 290 is for example carried out by CVD.

According to an embodiment, a step of CMP is then carried out. The surface is then cleaned in order to eliminate the polishing residue.

This step of CMP has for objective to de-short-circuit the source/drain zones from one another. For this, this step of CMP stops at the capping 260.

According to a third embodiment shown partially in FIGS. 20 to 23, the gate pattern 600 does not initially form a final gate. The gate pattern 600 is a sacrificial pattern for the forming of the spacers and is subsequently removed and replaced with a gate stack 610. In this third embodiment of the "gate-last" type, the step of reducing the dielectric permittivity of the spacers of the gate 610 can include a step of ion implantation, even two steps of ion implantations, with one or the other able to be carried out before the forming of the gate stack 610. This third embodiment shall now be described, preferentially suited in the case where the gate 610 is formed after the spacers.

According to an embodiment, this method can include the following steps:

a) Forming of a sacrificial gate pattern 600;
b) Deposition of a first dielectric layer in such a way as to cover at least the flanks of the gate pattern 600;
c) Forming of the first level of spacers 611 by partially etching the first dielectric layer in such a way as to retain it on the flanks of the gate patterns 600;
d) Cleaning of the surfaces of the underlying layer 30;
e) Forming of the source/drain zones 630;
f) Forming of a second dielectric layer 620 in such a way as to cover at least the flanks of the first level of spacers 611 of the gate pattern 600;
g) Forming of a first encapsulating layer 640;
h) Removing of the gate pattern 600;
i) Reducing of the dielectric permittivity of the first level of spacers 611 by ion implantation 700 on the internal faces 612 of the first spacer level 611. As such during this ion implantation the implanted spacer is not present on the source/drain zones. More preferably it is present only on the gate pattern.
j) Forming of the gate stack 610;
k) Partial removing of the first encapsulating layer 640;
l) Forming of the second level of spacers 621 by etching the second dielectric layer 620 outside of the flanks of the gate 610 in such a way as to expose at least partially the source/drain zones 630;
m) Silicidation in such a way as to allow for the forming of electrical contacts on at least a portion of the source/drain zones 630;
n) Reducing of the dielectric permittivity of the second level of spacers 621 by ion implantation on the external faces of the second level of spacers 621; As such during this ion implantation the implanted spacer is not present on the source/drain zones. Preferably it covers only the gate pattern. Preferably it covers only the flanks of the gate pattern.
o) Deposition of a second encapsulating layer.

As is described in what follows, according to an embodiment only one of the steps i) and n) of reducing the dielectric permittivity can be carried out, or both of them according to another embodiment. This possibility of having two steps of reducing the dielectric permittivity separate from one another and concerning different spacer levels confers an additional degree of freedom as to the adjustment of the dielectric permittivities of each one of the spacers so as to respond to precise technological needs.

The steps a) to g) of this third embodiment correspond to the steps shown in FIGS. 8 to 11 and to their description provided hereinabove. The gate pattern 600 does not correspond in this embodiment to a gate stack. Indeed, in this third embodiment, the gate 610 is carried out later, and it is from the sacrificial gate pattern 600 configured to be removed subsequently that are carried out the steps shown in FIGS. 8 to 11.

All of the steps, characteristics, examples of realization and advantages mentioned in reference to the embodiment shown in FIGS. 8 to 11 apply to this third embodiment by considering the gate stack 200 as a gate pattern 600.

Figure 21:
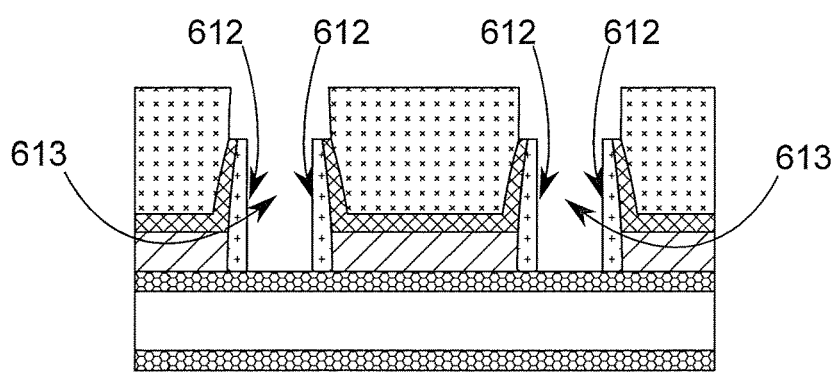

The following step is shown in FIGS. 20 and 21, it comprises the removing of a portion at least of the gate pattern 600, of a portion at least of the first level of spacers 611, and of a portion at least of the second dielectric layer 620, in such a way as to form a cavity 613. Advantageously this removing is carried out by etching. The gate pattern 600 is for example made of a material with a polycrystalline silicon base, also called polysilicon, and the removal thereof is advantageously carried out by wet etching. Here again this step is not specific to this embodiment and can be carried out by any technique known in prior art.

This step of removing is carried out in such a way as to define a cavity 613 between the two spacers forming the first level of spacers 611.

Figure 22:
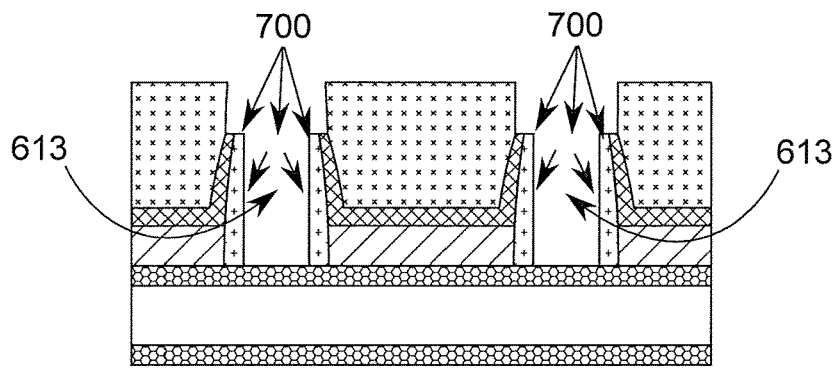

FIG. 22 shows a particularly advantageous characteristic. This figure has a step showing the reducing of the dielectric permittivity of the first level of spacers 611 after the forming for example of the source and of the drain by epitaxy.

All of the steps, characteristics, examples of realization and advantages mentioned in reference to the embodiment shown in FIG. 14 apply to the embodiment shown in FIG. 22.

Figure 23:
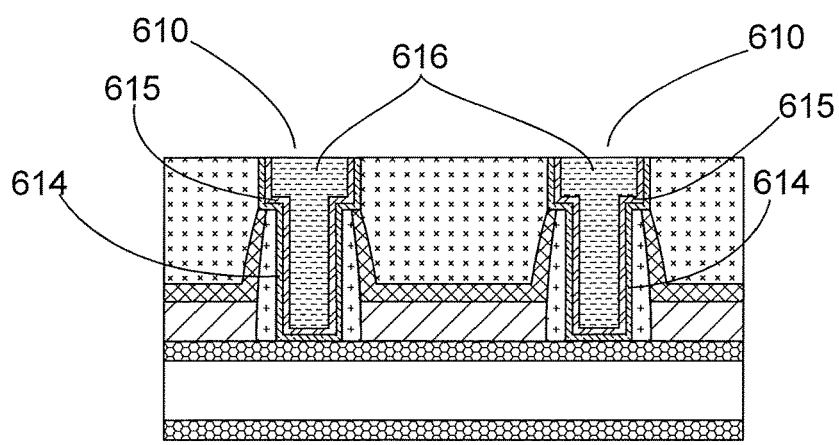
Figure 24:
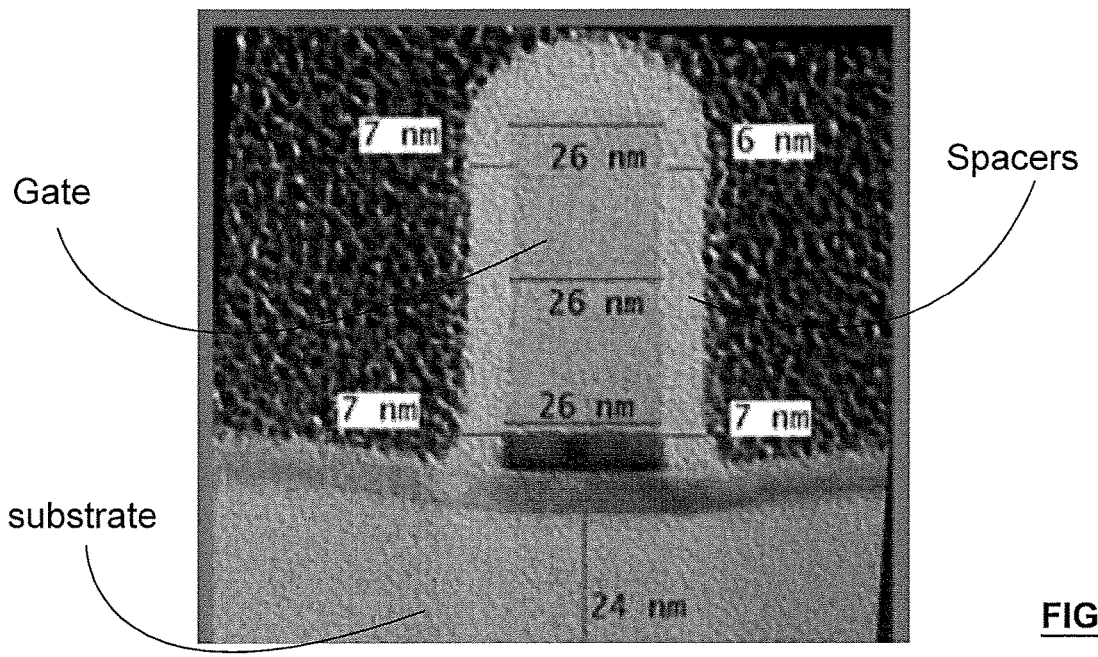
FIGS. 24 and 25 are electron microscopy images that show one of the problems of the current techniques.
Figure 25:
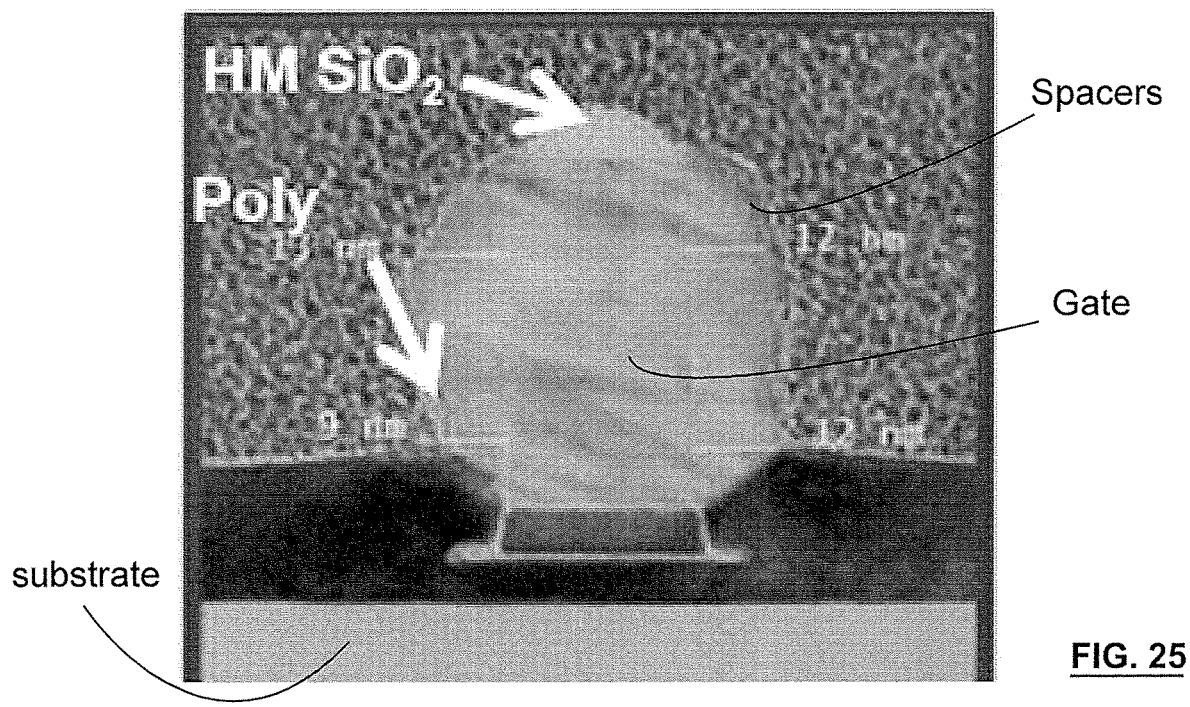

The following step is shown in FIG. 23 and relates to the forming of the stack of the functional gate 610 comprising a first layer 614, a second layer 615 and a third layer 616. This forming of the gate 610 as such comprises a plurality of depositions, preferably conformal, on the cavity 613 in such a way as to fill the cavity 613.

A first deposition is carried out in such a way as to form a first layer 614 comprised of a material of which the dielectric permittivity is high. For example, this material can be one from: SiON, HfO$_2$, HfSiON. Advantageously, this deposition is a conformal deposition. The thickness of this first layer 614 is preferably between 1 nm and 6 nm, and preferably equal to 3 nm.

The deposition of this first layer 614 can be carried out by any technique conventionally used by those skilled in the art for so called "gate-last" methods for example. Advantageously, this first deposition is carried out in such a way as to cover the bottom of the cavity 613, as well as the internal faces 612 of the first level of spacers 611.

A second deposition is carried out in such a way as to form a second layer 615 comprised of a metal. For example, this metal can be one from: TiN, TaN, Ta. Advantageously, this deposition is a conformal deposition.

The thickness of this second layer 615 is preferably between 1 nm and 10 nm, and preferably equal to 5 nm. The deposition of this second layer 615 can be carried out by any technique conventionally used by those skilled in the art for so called "gate-last" methods for example. Advantageously, this second deposition is carried out in such a way as to cover the first layer 614.

A third deposition is carried out in such a way as to form a third layer 616 comprised of tungsten. Advantageously, this deposition is a conformal deposition. The thickness of this third layer 616 is preferably between 50 nm and 100 nm, with this thickness being a function of the height and of the width of the gate 610 to be formed desired and/or of the cavity 613 to be filled. The deposition of this third layer 616 can be carried out by any technique conventionally used by those skilled in the art for so called "gate-last" methods for example. Advantageously, this third deposition is carried out in such a way as to cover the second layer 616.

According to a preferred embodiment, these three depositions are configured to entirely fill the cavity 613 and as such form the gate 610.

The steps subsequent to this third embodiment include all of the steps, characteristics, examples of realization and advantages mentioned in reference to the embodiment shown in FIGS. 16 to 19 with the gate 610 replacing the gate 200.

The first embodiment shown makes it possible to reduce the dielectric constant of the second level of spacers after the step of forming source/drain zones which in prior art is regularly responsible for the increase in the dielectric permittivity of gate spacers formed by materials of low dielectric permittivity.

The second embodiment provides two additional degrees of freedom by allowing for the reducing of the dielectric permittivity of the first and of the second level of spacers independently. As such, it is possible to carry out a first level of spacers and a second level of spacers of which the dielectric permittivities can be different or identical by implanting different or identical ions and this after the step of forming source/drain zones.

According to this embodiment shown in FIGS. 8 to 19, it is also possible to reduce the dielectric permittivity of only one among the two levels of spacers.

The third embodiment allows for the forming of the gate after the forming of the spacers and the step of reducing their dielectric permittivity. This embodiment benefits from the advantages of the preceding embodiments while still providing an additional degree of freedom in the choice of the materials of the gate which are no longer subjected to the steps of forming the source and the drain for example.

The invention is not limited to the embodiments described hereinabove and extends to all embodiments covered by the claims.

The invention claimed is:

1. A method for manufacturing a transistor using a stack comprising at least one gate pattern comprising at least one flank and being located above an underlying layer made of a semi-conductor material, the method comprising the following successive steps:
   forming, at least partially, at least one gate spacer by depositing at least one layer made of a non-carbon material on the at least one flank of the at least one gate pattern;
   after the depositing of the at least one layer made of a non-carbon material, performing at least one step of exposing the stack to a temperature greater than or equal to 600° C.;
   after the at least one step of exposing, performing at least one step of reducing of a dielectric permittivity of the at least one gate spacer, the reducing comprising at least one ion implantation in a portion at least of a thickness of the at least one gate spacer,
   wherein parameters of the at least one ion implantation including species implanted, energy, and implantation dose, being chosen such that the at least one ion implantation reduces the dielectric permittivity of the at least one gate spacer, and
   wherein, during the at least one ion implantation, the at least one gate spacer is present only on the at least one gate pattern; and
   at least one step of forming at least one source/drain zone in a peripheral zone surrounding the at least one gate pattern and located above the underlying layer, wherein the at least one step of forming of the at least one source/drain zone comprises
   the at least one step of exposing the stack to the temperature greater than or equal to 600° C., and
   a step of epitaxy of the at least one source/drain zone.

2. The method according to claim 1,
   wherein the step of forming the at least one source/drain zone further comprises an activation annealing of the at least one source/drain zone, and
   wherein the annealing comprises the at least one step of exposing at the temperature greater than or equal to 600° C.

3. The method according to claim 1,
   wherein the step of forming the at least one source/drain zone further comprises a step of epitaxy of the at least one source/drain zone, and
   wherein the step of epitaxy comprises said at least one step of exposing at the temperature greater than or equal to 600° C.

4. The method according to claim 1, wherein during the step of forming of the at least one source/drain zone, the at least one gate spacer has already been entirely formed.

5. The method according to claim 1, further comprising at least one step of silicidation of electrical contacts on a gate of the transistor and/or on the at least one source/drain zone, wherein the at least one step of silicidation comprises the at least one step of exposing at the temperature greater than or equal to 600° C.

6. The method according to claim 1, further comprising at least one step of wet cleaning of surfaces of the stack, wherein the at least one step of cleaning is performed before the step of reducing the dielectric permittivity.

7. The method according to claim 1, wherein the at least one ion implantation is performed with a base of ions with a hydrogen base or with a helium base.

8. The method according to claim 1, wherein the at least one ion implantation is performed by plasma.

9. The method according to claim 1, wherein the at least one ion implantation is performed by plasma at a pressure greater than or equal to 80 mTorr.

10. The method according to claim 1, wherein the at least one ion implantation is performed by an implanter.

11. The method according to claim 1, wherein the at least one ion implantation is performed so as to implant the at least one gate spacer over at least one portion of its thickness or so as to implant the at least one gate spacer over an entire thickness thereof.

12. The method according to claim 1, wherein during the at least one ion implantation the at least one gate spacer is entirely formed.

13. The method according to claim 1, wherein during the at least one ion implantation the at least one gate spacer is present only on the at least one gate pattern.

14. The method according to claim 1, wherein during the at least one ion implantation the at least one gate spacer is present only on the at least one flank of the at least one gate pattern.

15. The method according to claim 1, wherein the at least one gate spacer comprises at least one non-carbon material chosen from among SiN, BN, and $SiO_2$.

16. The method according to claim 1, wherein the at least one gate spacer comprises at least one material having a dielectric permittivity, after the step of reducing, of less than 7.

17. The method according to claim 1, wherein the forming of the at least one gate spacer comprises depositing a first dielectric layer on the at least one flank of the at least one gate pattern so as to form at least one first level of spacers.

18. The method according to claim 17, wherein the depositing of the first dielectric layer is followed by depositing of a second dielectric layer on the at least one first level of spacers of the at least one gate pattern so as to form at least one second level of spacers.

19. The method according to claim 1, wherein the at least one gate pattern is a gate stack formed before the forming of the at least one gate spacer.

20. The method according to claim 17, further comprising, after the forming of the at least one gate spacer, a step of removing of the at least one gate pattern so as to define a cavity between two spacers forming the at least one first level of spacers; and, after removing of the at least one gate pattern, a step of forming a gate stack.

21. The method according to claim 1, wherein, before the forming of the at least one gate pattern, the underlying layer made of the semi-conductor material has a hollow between two zones intended to form source/drain zones, and further comprising at least one step of realizing the at least one gate pattern such that the at least one gate pattern is at least partially located in the hollow.

22. The method according to claim 1, wherein the at least one gate stack is disposed between two spacers, and further comprising removing a portion of the at least one gate stack so as to define a cavity between the two spacers, wherein the at least one ion implantation is performed so as to implant at least one internal face of the two spacers, the at least one internal face being turned to face the cavity.

23. The method according to claim 18,
wherein the at least one ion implantation comprises a first ion implantation and a second ion implantation performed after the first ion implantation,
wherein the first ion implantation is performed to reduce a dielectric permittivity of the first level of spacers, and
wherein the at least one gate pattern is disposed between two spacers forming the first level of spacers,
the method further comprising removing the at least one gate pattern so as to define a cavity between the two spacers forming the first level of spacers,
wherein the first ion implantation is performed so as to implant at least one internal face of the first level of spacers, the internal face being turned to face the cavity, in order to reduce the dielectric permittivity of the first level of spacers.

24. The method according to claim 23, wherein the second ion implantation is performed to reduce the dielectric permittivity of the second level of spacers.

25. The method according to claim 24, further comprising exposing at least one external face of the second level of spacers,
wherein the second ion implantation is performed so as to implant the at least one external face of the second level of spacers so as to reduce the dielectric permittivity of the second level of spacers.

26. The method according to claim 23, wherein the first ion implantation is performed after a first step of silicidation of electrical contacts on a gate of the transistor and/or on a source/drain zone of the transistor.

27. The method according to claim 23, wherein the second ion implantation is performed after a second step of silicidation of electrical contacts on a gate of the transistor and/or on a source/drain zone of the transistor.

28. A method for manufacturing a transistor using a stack comprising at least one gate pattern comprising at least one flank and being located above an underlying layer made of a semi-conductor material, the method comprising the following successive steps:
forming, at least partially, at least one gate spacer by depositing at least one layer made of a non-carbon material on the at least one flank of the at least one gate pattern;
after the depositing of the at least one layer made of a non-carbon material, performing at least one step of exposing the stack to a temperature greater than or equal to 600° C.;
after the at least one step of exposing, performing at least one step of reducing of a dielectric permittivity of the at least one gate spacer, the reducing comprising at least one ion implantation in a portion at least of a thickness of the at least one gate spacer,
wherein parameters of the at least one ion implantation including species implanted, energy, and implantation dose, being chosen such that the at least one ion implantation reduces the dielectric permittivity of the at least one gate spacer,
wherein, during the at least one ion implantation, the at least one gate spacer is present only on the at least one gate pattern, and
wherein, before the forming of the at least one gate pattern, the underlying layer made of the semi-conductor material has a hollow between two zones intended to form source/drain zones; and at least one step of realizing the at least one gate pattern such that the at least one gate pattern is at least partially located in the hollow.

29. A method for manufacturing a transistor using a stack comprising at least one gate pattern comprising at least one flank and being located above an underlying layer made of a semi-conductor material, the method comprising the following successive steps:

forming, at least partially, at least one gate spacer by depositing at least one layer made of a non-carbon material on the at least one flank of the at least one gate pattern;

after the depositing of the at least one layer made of a non-carbon material, performing at least one step of exposing the stack to a temperature greater than or equal to 600° C.;

after the at least one step of exposing, performing at least one step of reducing of a dielectric permittivity of the at least one gate spacer, the reducing comprising at least one ion implantation in a portion at least of a thickness of the at least one gate spacer, wherein parameters of the at least one ion implantation including species implanted, energy, and implantation dose, being chosen such that the at least one ion implantation reduces the dielectric permittivity of the at least one gate spacer, wherein, during the at least one ion implantation, the at least one gate spacer is present only on the at least one gate pattern, wherein the at least one gate stack is disposed between two spacers; and removing a portion of the at least one gate stack so as to define a cavity between the two spacers, wherein the at least one ion implantation is performed so as to implant at least one internal face of the two spacers, the at least one internal face being turned to face the cavity.

30. A method for manufacturing a transistor using a stack comprising at least one gate pattern comprising at least one flank and being located above an underlying layer made of a semi-conductor material, the method comprising the following successive steps:

forming, at least partially, at least one gate spacer by depositing at least one layer made of a non-carbon material on the at least one flank of the at least one gate pattern;

after the depositing of the at least one layer made of a non-carbon material, performing at least one step of exposing the stack to a temperature greater than or equal to 600° C.;

after the at least one step of exposing, performing at least one step of reducing of a dielectric permittivity of the at least one gate spacer, the reducing comprising at least one ion implantation in a portion at least of a thickness of the at least one gate spacer, wherein parameters of the at least one ion implantation including species implanted, energy, and implantation dose, being chosen such that the at least one ion implantation reduces the dielectric permittivity of the at least one gate spacer, and wherein, during the at least one ion implantation, the at least one gate spacer is present only on the at least one gate pattern, wherein the forming of the at least one gate spacer comprises depositing a first dielectric layer on the at least one flank of the at least one gate pattern so as to form at least one first level of spacers, wherein the depositing of the first dielectric layer is followed by depositing of a second dielectric layer on the at least one first level of spacers of the at least one gate pattern so as to form at least one second level of spacers, wherein the at least one ion implantation comprises a first ion implantation and a second ion implantation performed after the first ion implantation, wherein the first ion implantation is performed to reduce a dielectric permittivity of the first level of spacers, and wherein the at least one gate pattern is disposed between two spacers forming the first level of spacers; and removing the at least one gate pattern so as to define a cavity between the two spacers forming the first level of spacers, wherein the first ion implantation is performed so as to implant at least one internal face of the first level of spacers, the internal face being turned to face the cavity, in order to reduce the dielectric permittivity of the first level of spacers.

* * * * *